(12) United States Patent
Haraguchi et al.

(10) Patent No.: US 12,317,521 B2
(45) Date of Patent: May 27, 2025

(54) CAPACITOR DEVICE AND MANUFACTURING METHOD THEREFOR

(71) Applicants: AP Memory Technology Corp., Zhubei (TW); AP Memory Technology (Hangzhou) Limited Co., Hangzhou (CN)

(72) Inventors: Masaru Haraguchi, Tokyo (JP); Yoshitaka Fujiishi, Tokyo (JP); Wenliang Chen, Zhubei (TW)

(73) Assignees: AP Memory Technology Corp., Zhubei (TW); AP Memory Technology (Hangzhou) Limited Co., Hangzhou (CN)

( * ) Notice: Subject to any disclaimer, the term of this patent is extended or adjusted under 35 U.S.C. 154(b) by 1064 days.

(21) Appl. No.: 17/085,770

(22) Filed: Oct. 30, 2020

(65) Prior Publication Data

US 2021/0050410 A1 Feb. 18, 2021

Related U.S. Application Data

(63) Continuation-in-part of application No. 16/609,159, filed as application No. PCT/JP2017/016977 on Apr. 28, 2017, now Pat. No. 11,038,012.

(51) Int. Cl.
*H10D 1/68* (2025.01)
*H01L 23/522* (2006.01)

(52) U.S. Cl.
CPC ......... *H10D 1/716* (2025.01); *H01L 23/5226* (2013.01)

(58) Field of Classification Search
None
See application file for complete search history.

(56) References Cited

U.S. PATENT DOCUMENTS 6,770,974 B2 8/2004 Ejiri
9,472,690 B2 10/2016 Weng et al.
(Continued)

FOREIGN PATENT DOCUMENTS

JP 60-103690 A 6/1985
JP 4-111462 A 4/1992
(Continued)

OTHER PUBLICATIONS

Sheikholeslami, A. "A survey of circuit innovations in ferroelectric random-access memories" Proc. Of IEEE Vo. 88, Iss. 5 May 2000 pp. 667-689 (Year: 2000).*
(Continued)

*Primary Examiner* — Grant S Withers
(74) *Attorney, Agent, or Firm* — Chen Yoshimura LLP

(57) ABSTRACT

A capacitor device includes: a substrate; an insulation film, disposed on the substrate; at least one capacitor unit cell, being covered by the insulation film on the substrate, the at least one capacitor unit cell having at least one first electrode and at least one second electrode disposed over the first electrode; an exposed conductive layer, disposed on the at least one capacitor unit cell and the insulation film, the exposed conductive layer having a first conductive pad formed on a first side of the exposed conductive layer and a second conductive pad formed on a second side different from the first side; wherein the first conductive pad and the second conductive pad are electrically connected to the at least one first electrodes and the at least one second electrodes of the at least one capacitor unit cell respectively.

12 Claims, 43 Drawing Sheets

(56) References Cited

U.S. PATENT DOCUMENTS

| | | |
|---|---|---|
| 2001/0023110 A1 | 9/2001 | Fukuzumi et al. |
| 2002/0030243 A1 | 3/2002 | Mikawa et al. |
| 2002/0180053 A1 | 12/2002 | Ejiri |
| 2004/0084709 A1 | 5/2004 | Kim et al. |
| 2007/0077721 A1* | 4/2007 | Kanaya ................. H10B 53/30 438/396 |
| 2007/0080382 A1 | 4/2007 | Kikuchi et al. |
| 2007/0141800 A1 | 6/2007 | Kurihara et al. |
| 2007/0291439 A1 | 12/2007 | Yeh |
| 2008/0073685 A1 | 3/2008 | Wang |
| 2008/0079117 A1 | 4/2008 | Baumgartner et al. |
| 2009/0219668 A1 | 9/2009 | Hsu et al. |
| 2011/0019335 A1 | 1/2011 | Wu et al. |
| 2016/0204190 A1 | 7/2016 | Chu et al. |
| 2016/0293334 A1 | 10/2016 | Ehara et al. |
| 2017/0018550 A1* | 1/2017 | Shih ..................... H01L 27/101 |
| 2018/0247997 A1 | 8/2018 | Zeiner et al. |

FOREIGN PATENT DOCUMENTS

| | | |
|---|---|---|
| JP | 11-289062 A | 10/1999 |
| JP | 2002-43517 A | 2/2002 |
| JP | 2003-124329 A | 4/2003 |
| JP | 2011-40571 A | 2/2011 |
| JP | 2011-66284 A | 3/2011 |
| JP | 2012-227431 A | 11/2012 |
| JP | 2016-195160 A | 11/2016 |
| TW | 200725658 A | 7/2007 |
| TW | 200945387 A | 11/2009 |
| TW | 201104714 A | 2/2011 |
| WO | 2002/003458 A1 | 1/2002 |

OTHER PUBLICATIONS

Taiwanese Office Action, dated Dec. 2, 2022, in a counterpart Taiwanese patent application, No. TW 110139694. Concise Summary of Taiwanese Office Communication and English translation of the search report are appended after the Chinese language document in the same PDF.).

International Search Report in the parent PCT application No. PCT/JP2017/016977, dated Jun. 27, 2017.

Written Opinion in the parent PCT application No. PCT/JP2017/016977, dated Jun. 27, 2017.

* cited by examiner

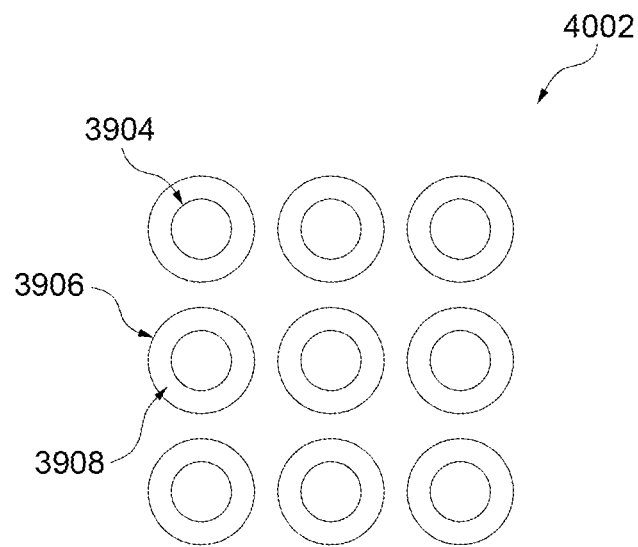
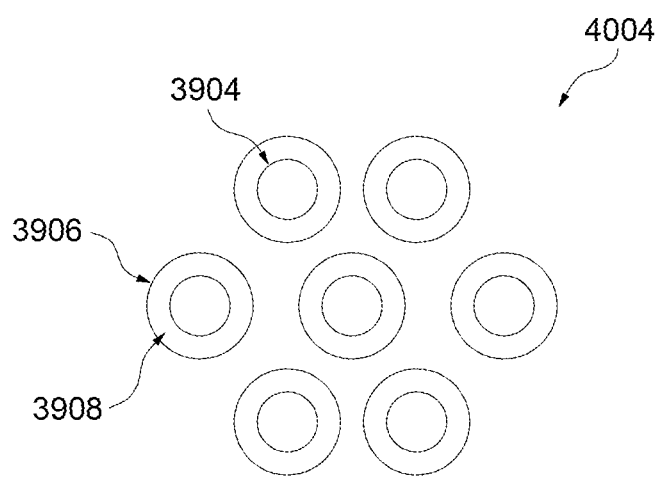
FIG. 40

CAPACITOR DEVICE AND MANUFACTURING METHOD THEREFOR

PRIORITY CLAIM AND CROSS-REFERENCE

This application is a continuation-in-part of pending U.S. application Ser. No. 16/609,159, filed Oct. 28, 2019, which is a National Phase of PCT/JP2017/016977, filed Apr. 28, 2017, the entire contents of which are incorporated herein by reference.

FIELD OF THE INVENTION

The present invention relates to a capacitor device including one or a plurality of capacitor cells formed on a semiconductor substrate, and a manufacturing method thereof.

BACKGROUND OF THE INVENTION

Capacitor devices that include one or more capacitor cells formed on a semiconductor substrate using semiconductor process technology are known. Such a capacitor device is required to satisfy various requirements such as an increase in capacity, a reduction in size, a reduction in manufacturing cost, and ease of design change.

Patent Document 1 (U.S. Pat. No. 9,472,690) discloses a trench capacitor having a structure formed in a direction perpendicular to the surface of a semiconductor substrate.

SUMMARY OF THE INVENTION

Capacitor devices are required to reduce the diameter and spacing of terminals (solder balls, etc.) and the thickness of the capacitor device for further circuit integration.

In the case of the trench capacitor as disclosed in Patent Document 1, since the trench capacitor is formed in the silicon substrate, when the surface of the silicon substrate is polished in the manufacturing process, it is necessary to polish so as to leave the capacitor portion. Therefore, the thickness (depth) of the silicon substrate that can be reduced by polishing is limited. In addition, the depth of trench capacitors is increasing with the miniaturization of semiconductor process technology, and there are trench capacitors having a depth exceeding 10 µm. Therefore, as the depth of the trench capacitor increases, the final capacitor device thickness also increases. Accordingly, there is a need for a capacitor device having a reduced thickness compared to the conventional one without being subject to such restrictions.

In addition, when manufacturing a capacitor device having characteristics such as different capacitance, different capacitance density (capacity per unit volume), different breakdown voltage, and/or different positions and number of terminals using semiconductor process technology. If so, it was necessary to remake the mask, which was very expensive. Accordingly, there is a need for a capacitor device that can be manufactured by changing the characteristics of the capacitor described above at a lower cost than before.

An object of the present invention is to provide a capacitor device including one or a plurality of capacitor cells formed on a semiconductor substrate and having a thickness reduced as compared with the conventional one.

Another object of the present invention is a capacitor device including one or a plurality of capacitor cells formed on a semiconductor substrate, which can be manufactured by changing the characteristics of the capacitor described above at a lower cost than in the past.

A further object of the present invention is to provide a method for manufacturing such a capacitor device.

One aspect of the present invention is to provide a capacitor device. The capacitor device comprises: a substrate; an insulation film, disposed on the substrate; at least one capacitor unit cell, being covered by the insulation film on the substrate, the at least one capacitor unit cell having at least one first electrode and at least one second electrode disposed over the first electrode; an exposed conductive layer, disposed on the at least one capacitor unit cell and the insulation film, the exposed conductive layer having a first conductive pad formed on a first side of the exposed conductive layer and a second conductive pad formed on a second side different from the first side; wherein the first conductive pad and the second conductive pad are electrically connected to the at least one first electrodes and the at least one second electrodes of the at least one capacitor unit cell respectively.

Another aspect of the present invention is to provide a capacitor device. The capacitor device comprises: a substrate; a stack capacitor, disposed on the substrate; an interconnect structure, disposed on the stack capacitor, the interconnect structure having an exposed conductive layer configured to have a first conductive pad and a second conductive pad; wherein the first conductive pad is electrically connected to a first electrode of the stack capacitor and the second conductive pad is electrically connected to a second electrode of the stack capacitor.

The Invention's Effect

According to the present invention, it is possible to provide a capacitor device including one or a plurality of capacitor cells formed on a semiconductor substrate, the capacitor device having a thickness reduced as compared with the related art.

In addition, according to the present invention, a capacitor device including one or a plurality of capacitor cells formed on a semiconductor substrate, which can be manufactured by changing the characteristics of the capacitor described above at a lower cost than in the past.

Furthermore, according to the present invention, a method for manufacturing such a capacitor device can be provided.

BRIEF DESCRIPTION OF THE DRAWINGS

FIG. 40 is a top view diagram illustrating a plurality of capacitor cells according to an embodiment of the present invention.

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons of ordinary skill in the art having the benefit of the present disclosure will understand other variations for implementing embodiments within the scope of the present disclosure, including those specific examples described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

Hereinafter, embodiments of the present invention will be described with reference to the drawings.

First Embodiment

Figure 1:
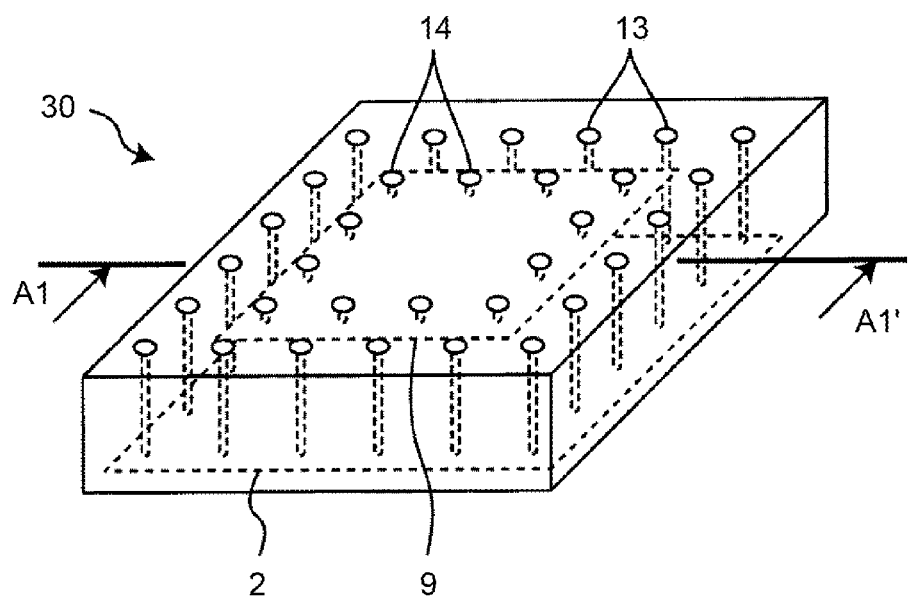
FIG. 1 is a perspective view showing a configuration of a capacitor device according to a first embodiment.

FIG. 1 is a perspective view showing the configuration of the capacitor device according to the first embodiment. The capacitor device of FIG. 1 includes a capacitor cell 30 formed on a semiconductor substrate having a first surface and a second surface. In the example of this specification, the lower surface of the capacitor device is a first surface, and the upper surface of the capacitor device is a second surface. The capacitor cell 30 includes a first electrode including the metal film 2, a second electrode including the metal film 9, and an insulating film (not shown in FIG. 1) formed between the first and second electrodes. In the example of the present specification, the first electrode including the metal film 2 is also referred to as a lower electrode, and the second electrode including the metal film 9 is also referred to as an upper electrode. The capacitor device is electrically connected to the lower electrode including the metal film 2 and electrically connected to at least one first cell terminal including the pad conductor 13 exposed on the upper surface of FIG. 1 and the upper electrode including the metal film 9. And at least one second cell terminal including a pad conductor 14 exposed on the upper surface shown in the figure. In the example of the present specification, the capacitor device includes a plurality of first cell terminals each including a pad conductor 13 and a plurality of second cell terminals each including a pad conductor 14.

Figure 2:
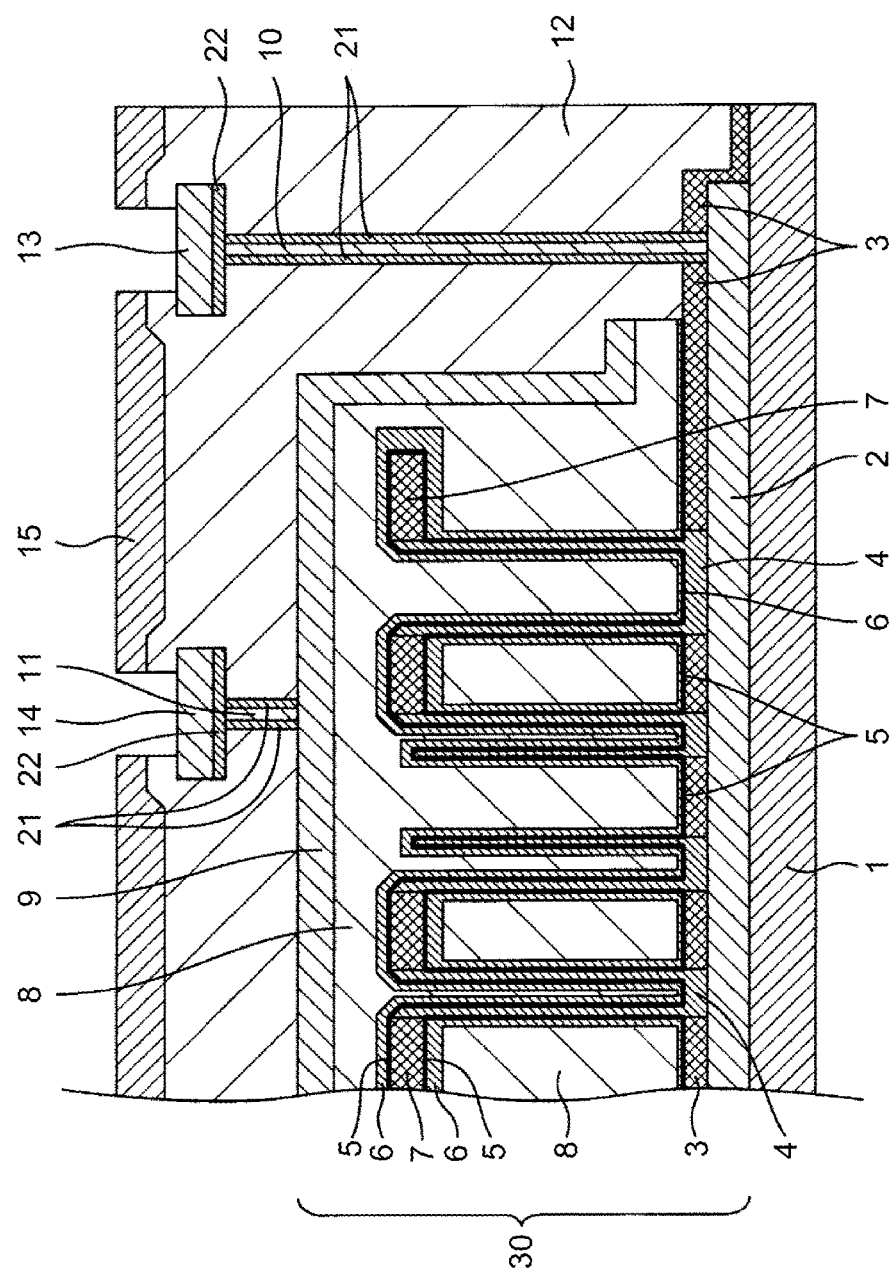
FIG. 2 is a diagram showing a part of a longitudinal section taken along line A1-A1' of the capacitor device of FIG. 1.

FIG. 2 is a diagram showing a part of a longitudinal section taken along the line A1-A1' of the capacitor device of FIG. 1.

The capacitor device includes an oxide film 1 exposed on the lower surface. In this specification, the oxide film 1 is also referred to as a first silicon oxide film.

The capacitor device is formed on the oxide film 1 and formed between a lower electrode including a plurality of stacked conductor films, an upper electrode including a plurality of stacked conductor films, and the lower electrode and the upper electrode. The insulating film 5 is provided.

The lower electrode includes a metal film 2 made of tungsten and a conductor film 4 made of Ti—TiN as conductor films. The metal film 2 and the conductor film 4 are electrically connected to each other and function as an integrated lower electrode. The conductor film 4 functions as a barrier metal. The lower electrode further includes a nitride film 3.

The upper electrode includes a conductor film 6 made of Ti—TiN, doped silicon 8 and a metal film 9 made of tungsten as conductor films. The doped silicon 8 fills the hollow space of the crown type stack capacitor with good coverage and improves its mechanical strength. As the doped silicon 8, a boron-doped silicon germanium film may be used. The conductor film 6, the doped silicon 8, and the metal film 9 are electrically connected to each other and function as an integral upper electrode. The upper electrode further includes a nitride film 7.

The insulating film 5 is made of, for example, a high dielectric material. The insulating film 5 includes, as a high dielectric material, for example, one or more of $Ta_2O_5$ material, $Al_2O_3$ material, $HfO_2$ material, $ZrO_2$ material, and $TiO_2$ material.

The lower electrode, the upper electrode, and the insulating film 5 form a capacitor cell 30. Since each of the lower electrode and the upper electrode includes at least one metal film 2 and 9, the capacitor cell 30 is formed as an MIM (Metal-Insulator-Metal) capacitor. The capacitor cell 30 is formed as a crown type stack capacitor as shown in FIG. 2.

The capacitor device includes an interlayer oxide film 12 formed on the metal film 9 of the upper electrode. In this specification, the interlayer oxide film 12 is also referred to as a second silicon oxide film. The capacitor device includes a passivation film 15 formed on the interlayer oxide film 12 and exposed on the upper surface. The passivation film 15 functions as a protective film that protects the upper surface of the capacitor device.

The capacitor device is electrically connected to the metal film 2 of the lower electrode and is at least one first cell terminal exposed on the upper surface and electrically connected to the metal film 9 of the upper electrode and exposed at least on the upper surface. One second cell terminal. Each first cell terminal includes a pad conductor 13 exposed on the upper surface and a via conductor 10 electrically connected from the pad conductor 13 to the metal film 2 of the lower electrode. In this specification, the pad conductor 13 is also referred to as a first pad conductor, and the via conductor 10 is also referred to as a first via conductor. Each second cell terminal includes a pad conductor 14 exposed on the upper surface and a via conductor 11 electrically connected from the pad conductor 14 to the metal film 9 of the upper electrode. In this specification, the pad conductor 14 is also referred to as a second pad conductor, and the via conductor 11 is also referred to as a second via conductor. A barrier metal 21 is formed around the via conductors 10 and 11, and a barrier metal 22 is formed on the lower surfaces of the pad conductors 13 and 14.

Figure 3:
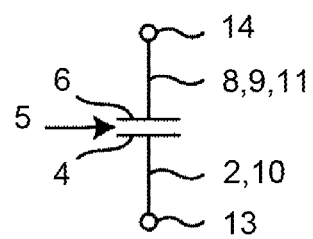
FIG. 3 is a circuit diagram showing an equivalent circuit of the capacitor device of FIG. 2.

FIG. 3 is a circuit diagram showing an equivalent circuit of the capacitor device of FIG. 2. The conductor films 4 and 6 are capacitively coupled to each other through the insulating film 5. The conductor film 4 is electrically connected to the pad conductor 13 through the metal film 2 and the via conductor 10. The conductor film 6 is electrically connected to the pad conductor 14 via the doped silicon 8, the metal film 9, and the via conductor 11. Thereby, the capacitor device functions as a capacitor.

Next, a manufacturing process of the capacitor device of FIG. 1 will be described with reference to FIG. 4 to FIG. 13.

Figure 4:
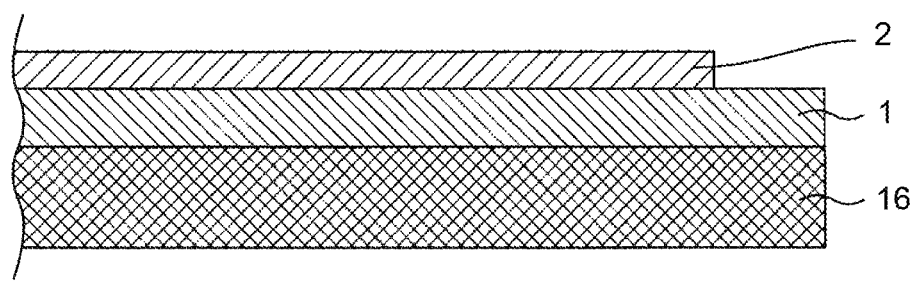
FIG. 4 is a cross-sectional view showing a first state in the manufacturing process of the capacitor device of FIG. 1.

FIG. 4 is a cross-sectional view showing a first state in the manufacturing process of the capacitor device of FIG. 1. FIG. 4 shows a state in which the oxide film 1 and the metal film 2 are formed on the silicon substrate 16 and patterned with a resist mask (not shown). In order to form the oxide film 1 and the metal film 2 on the silicon substrate 16, a conventional method can be used. For example, in order to form the oxide film 1, a thermal oxide film having a high film density may be used as a material that can withstand the mechanical strength at the time of back surface polishing described later.

Figure 5:
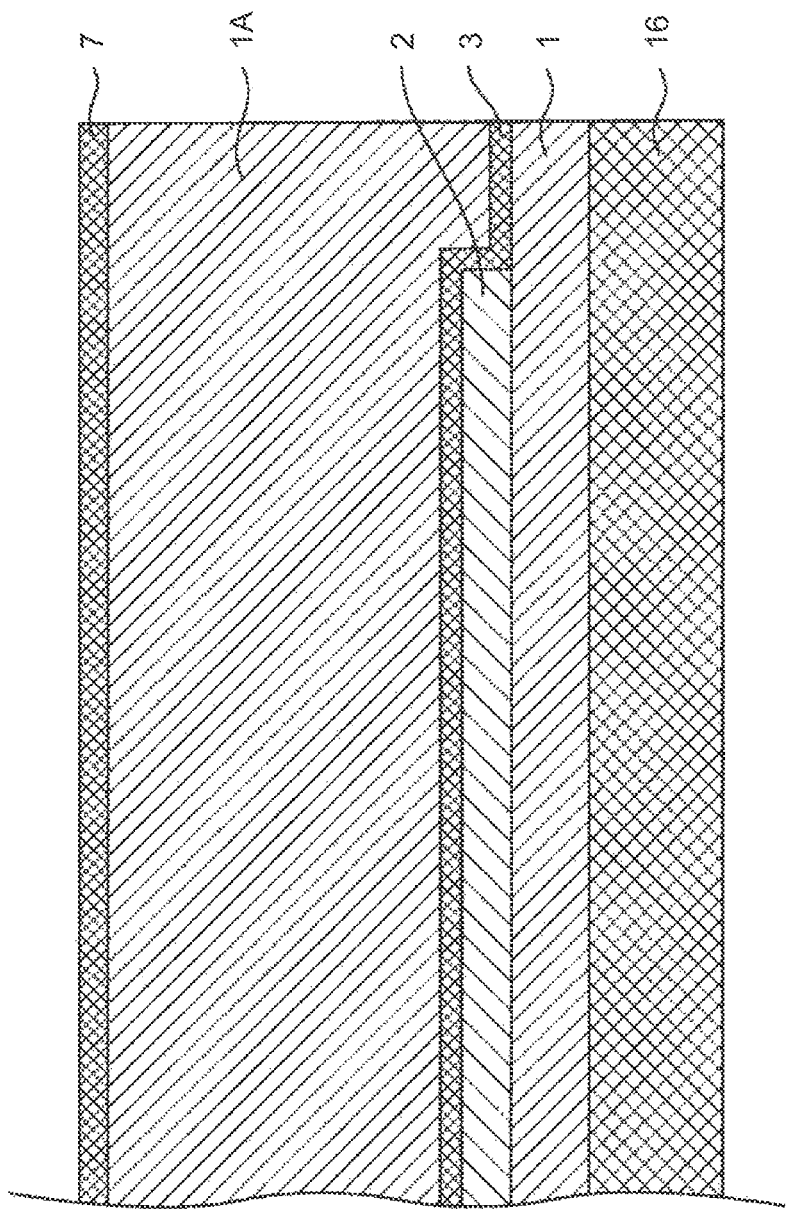
FIG. 5 is a cross-sectional view showing a second state in the manufacturing process of the capacitor device of FIG. 1.

FIG. 5 is a cross-sectional view showing a second state in the manufacturing process of the capacitor device of FIG. 1. FIG. 5 shows a state where the nitride film 3, another oxide film 1A, and the nitride film 7 are formed after the oxide film 1 and the metal film 2 are formed. Prior art methods can be used to form nitride film 3, another oxide film 1A, and nitride film 7. The nitride film 7 is formed in order to prevent the crown-type stacked capacitor electrode from falling down in a later step.

Figure 6:
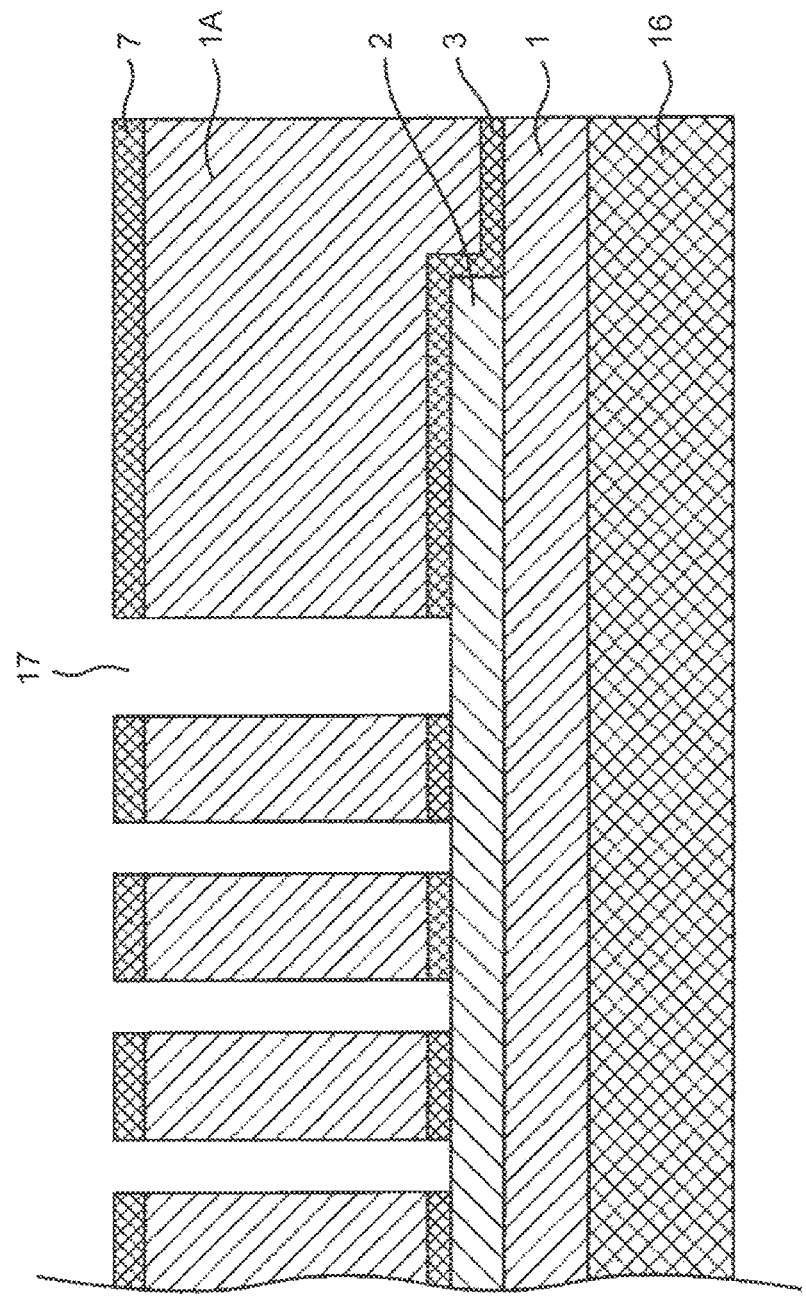
FIG. 6 is a cross-sectional view showing a third state in the manufacturing process of the capacitor device of FIG. 1.

FIG. 6 is a cross-sectional view showing a third state in the manufacturing process of the capacitor device of FIG. 1. FIG. 6 shows a state in which the nitride film 7, the oxide film 1A, and the nitride film 3 are patterned and etched to form an opening 17 for the stack capacitor. Prior art methods can be used to pattern and etch the nitride film 7, the oxide film 1A, and the nitride film 3.

Figure 7:
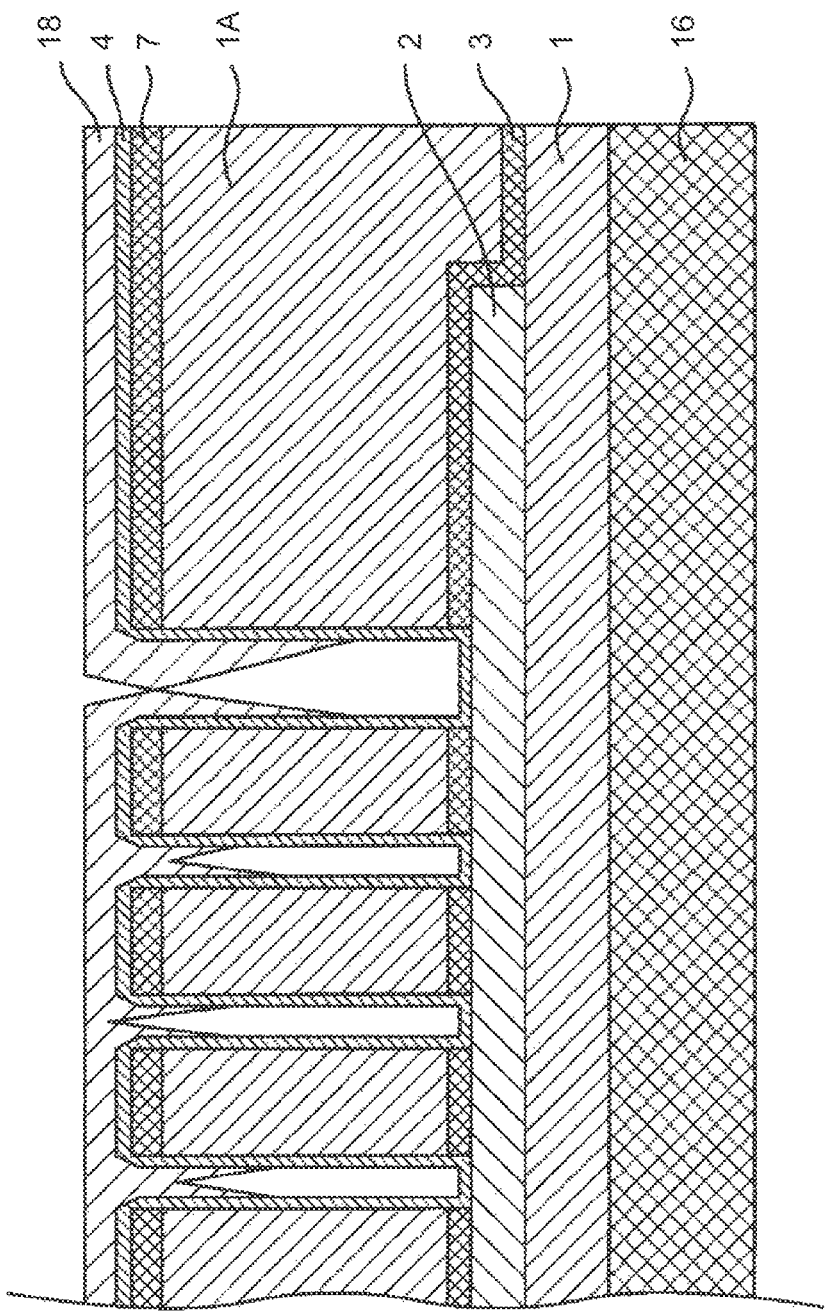
FIG. 7 is a cross-sectional view showing a fourth state in the manufacturing process of the capacitor device of FIG. 1.

FIG. 7 is a cross-sectional view showing a fourth state in the manufacturing process of the capacitor device of FIG. 1. FIG. 7 shows a state in which the conductor film 4 is formed and the oxide film 18 is further formed. Prior art methods can be used to form the conductor film 4 and the oxide film 18.

Figure 8:
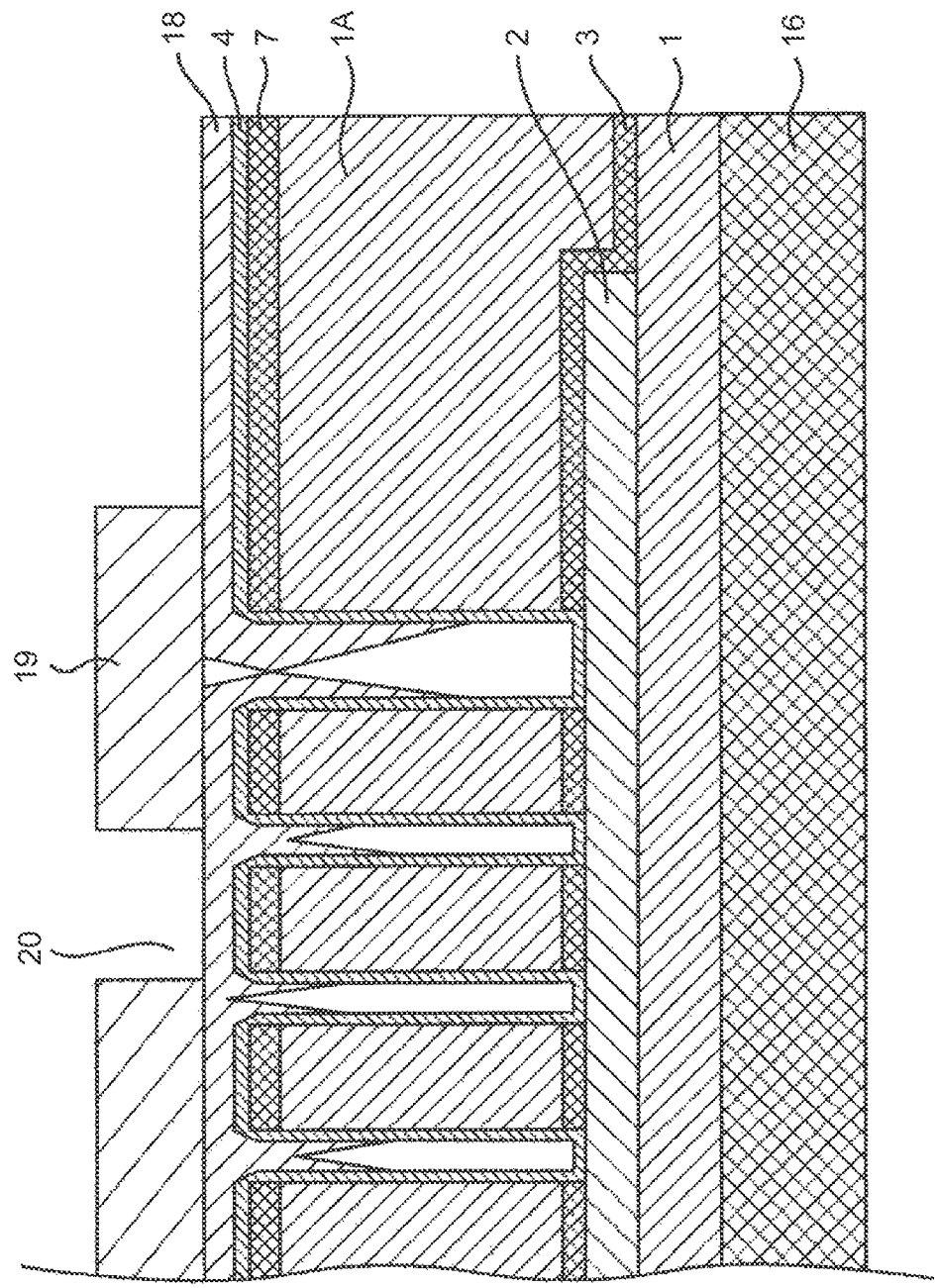
FIG. 8 is a cross-sectional view showing a fifth state in the manufacturing process of the capacitor device of FIG. 1.

FIG. 8 is a sectional view showing a fifth state in the manufacturing process of the capacitor device of FIG. 1.

FIG. 8 shows a state in which the opening 20 for forming the crown type stack capacitor is patterned by the photoresist 19.

Figure 9:
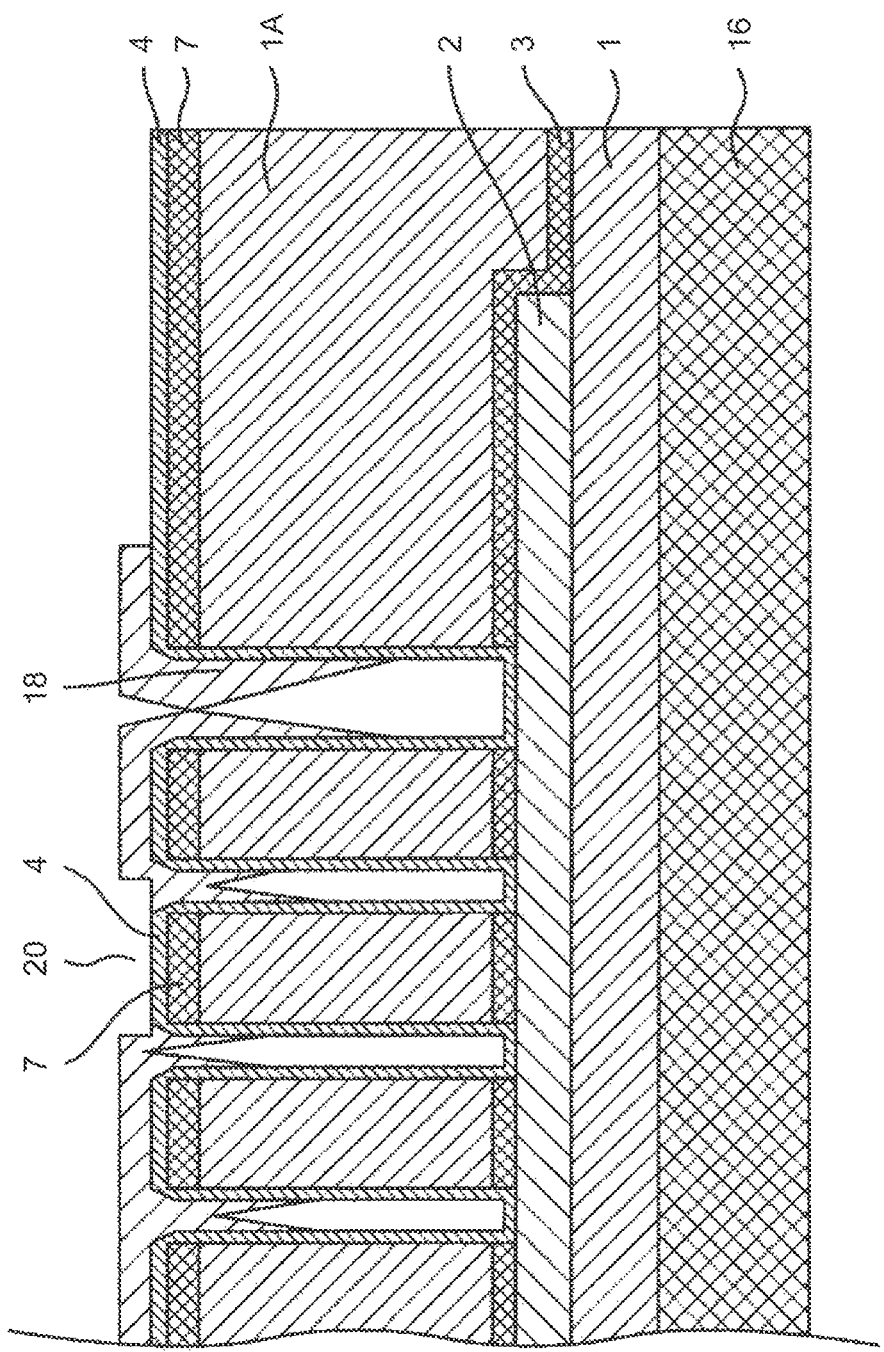
FIG. 9 is a cross-sectional view showing a sixth state in the manufacturing process of the capacitor device of FIG. 1.

FIG. 9 is a sectional view showing a sixth state in the manufacturing process of the capacitor device of FIG. 1. FIG. 9 shows a state in which the photoresist 19 is removed after the oxide film 18 in the opening 20 is etched. Thereafter, the conductor film 4 and the nitride film 7 in the opening 20 are etched using the oxide film 18 as a mask (not shown). At this time, the oxide film 18 and the conductor film 4 serving as a mask are also removed in a self-aligned manner, and a remaining structure of the conductor film 4 forms a crown-shaped structure. Even if the conductor film 4 that becomes a mask remains after etching, it can be removed by performing additional etching only on the conductor film 4.

Figure 10:
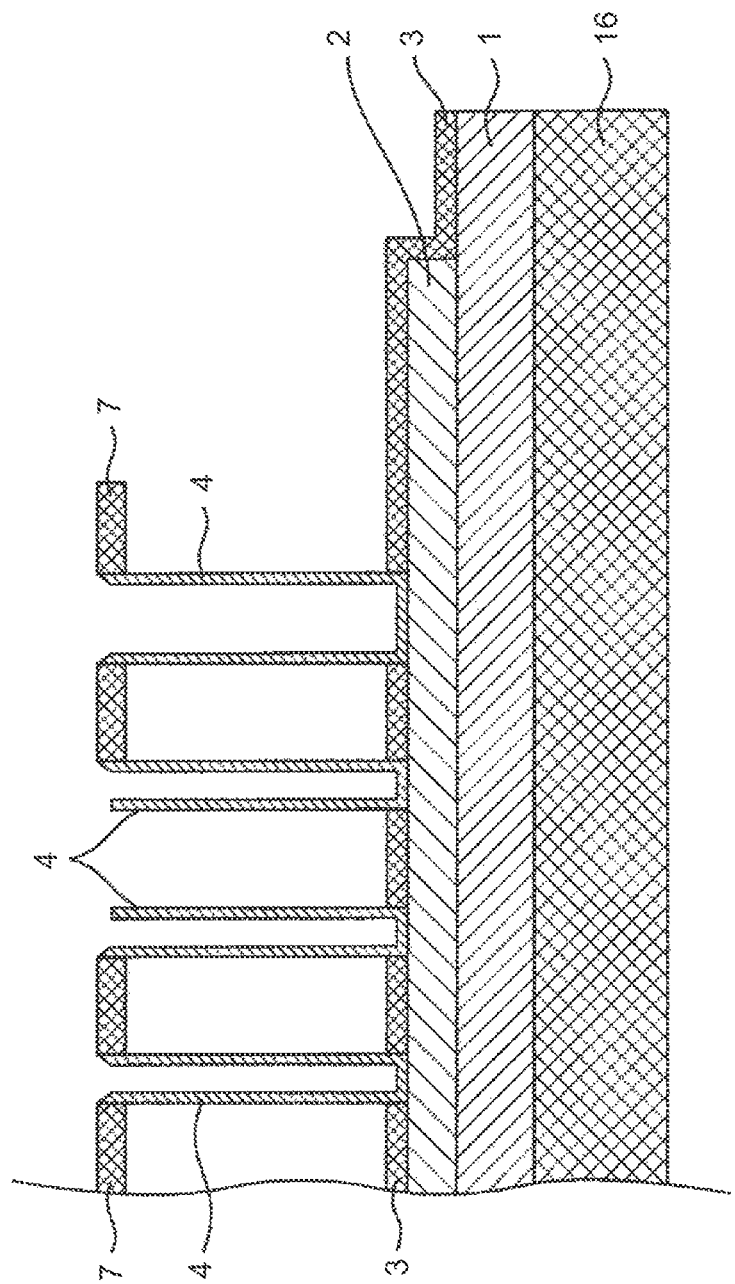
FIG. 10 is a cross-sectional view showing a seventh state in the manufacturing process of the capacitor device of FIG. 1.

FIG. 10 is a sectional view showing a seventh state in the manufacturing process of the capacitor device of FIG. 1. FIG. 10 shows a state in which the oxide film 1A remaining immediately under the side wall of the conductor film 4 and the nitride film 7 is removed from the opening formed at the position of the opening 20 in FIG. 9 by a wet process. As a result, a lower electrode including the metal film 2 and the conductor film 4 as a plurality of stacked conductor films is formed on the oxide film 1.

Figure 11:
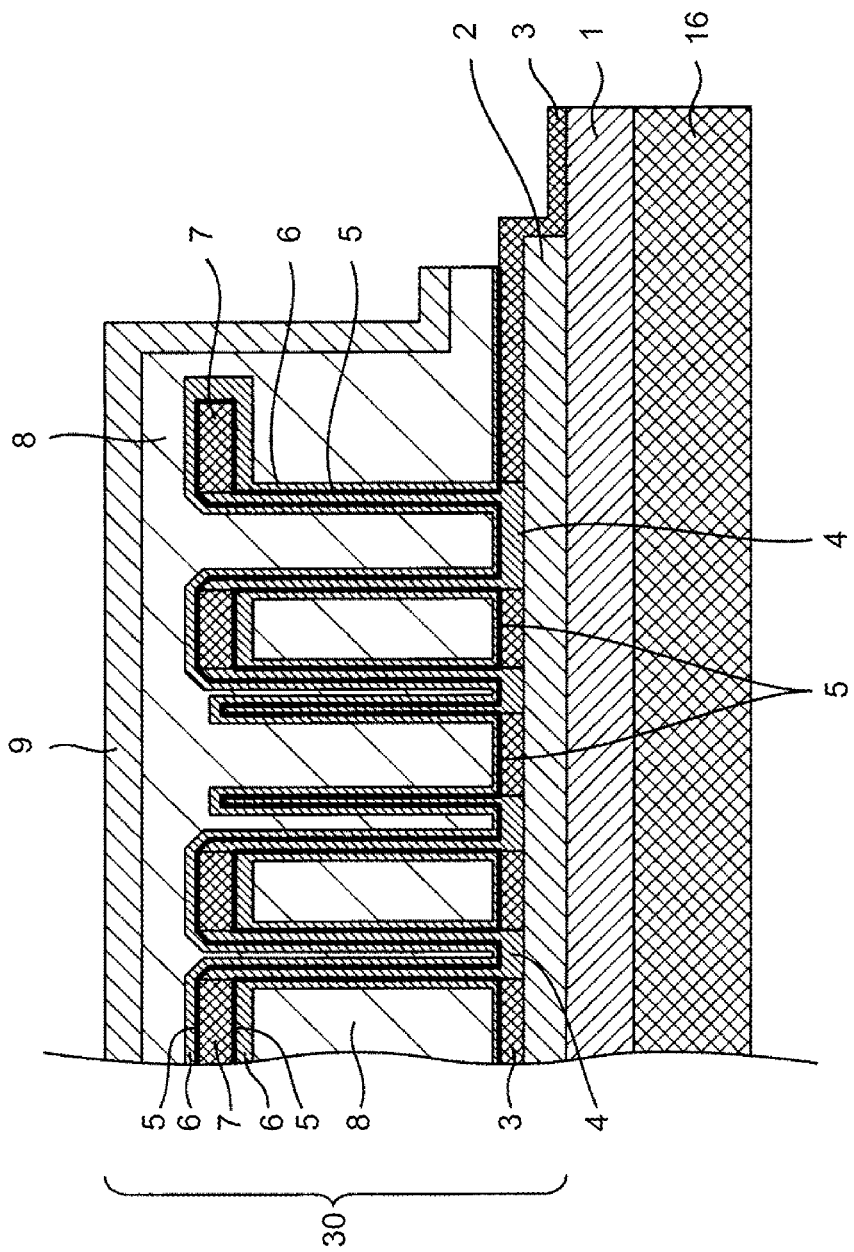
FIG. 11 is a cross-sectional view showing an eighth state in the manufacturing process of the capacitor device of FIG. 1.

FIG. 11 is a sectional view showing an eighth state in the manufacturing process of the capacitor device of FIG. 1. In FIG. 11, the insulating film 5 is formed on the conductor film 4, and the conductor film 6, the doped silicon 8, and the metal film 9 are sequentially formed on the insulating film 5, and then the insulating film 5, the doped silicon is formed. 8 and the metal film 9 are patterned by etching. In order to pattern the insulating film 5, the doped silicon 8, and the metal film 9 by etching, a conventional method can be used. Thereby, the insulating film 5 is formed on the lower electrode, and the upper electrode including the conductor film 6, the doped silicon 8, and the metal film 9 is formed on the insulating film 5 as a plurality of stacked conductor films. Is done.

Figure 12:
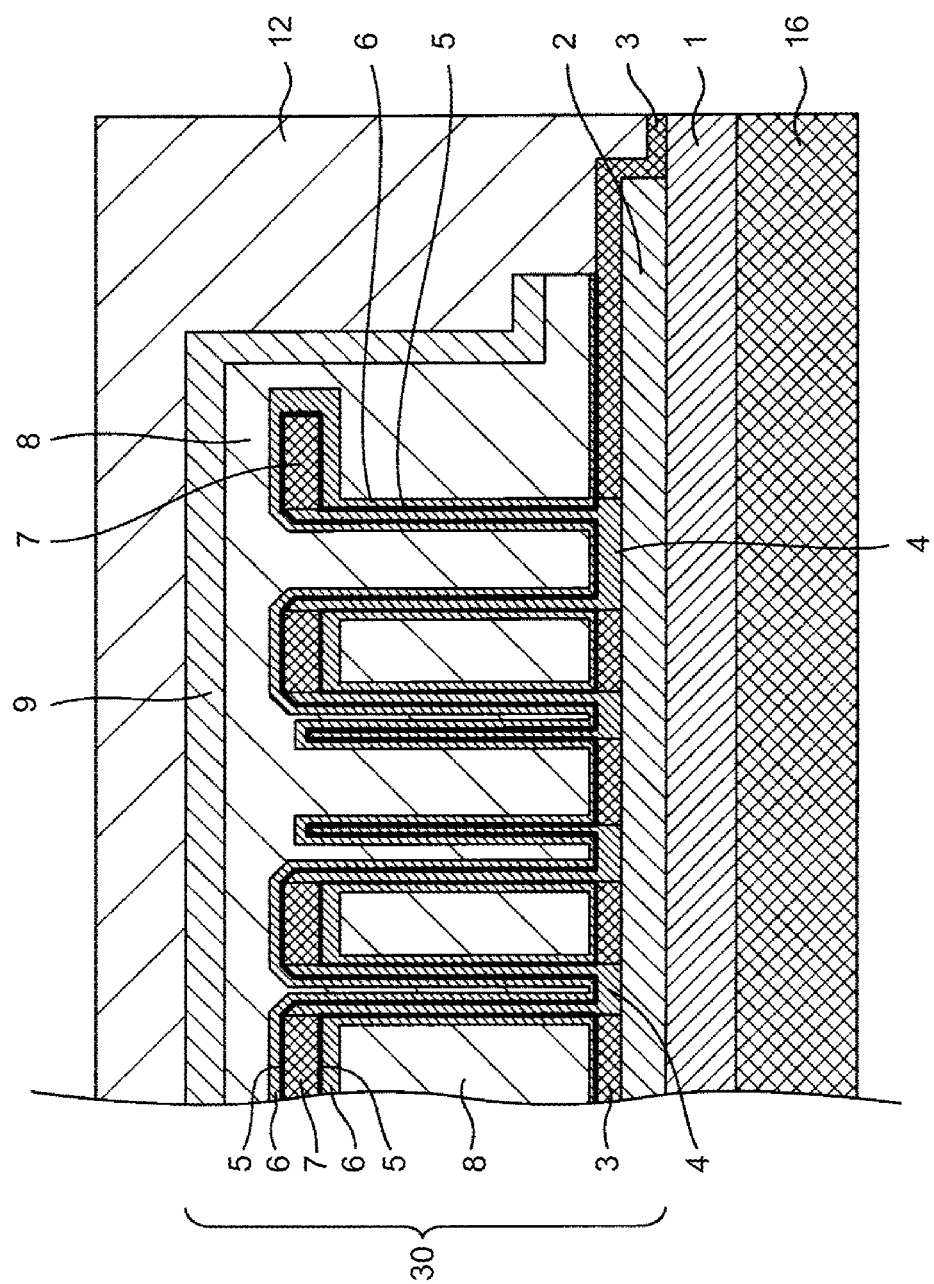
FIG. 12 is a cross-sectional view showing a ninth state in the manufacturing process of the capacitor device of FIG. 1.

FIG. 12 is a cross-sectional view showing a ninth state in the manufacturing process of the capacitor device of FIG. 1. FIG. 12 shows a state in which an interlayer oxide film 12 is formed and planarized on the nitride film 3 and the metal film 9 of the upper electrode. Prior art methods can be used to form and planarize the interlayer oxide film 12. The planarization may be performed using a chemical mechanical polishing technique, may be performed by removing only the oxide film on the convex portion by patterning and etching, or a combination thereof.

Figure 13:
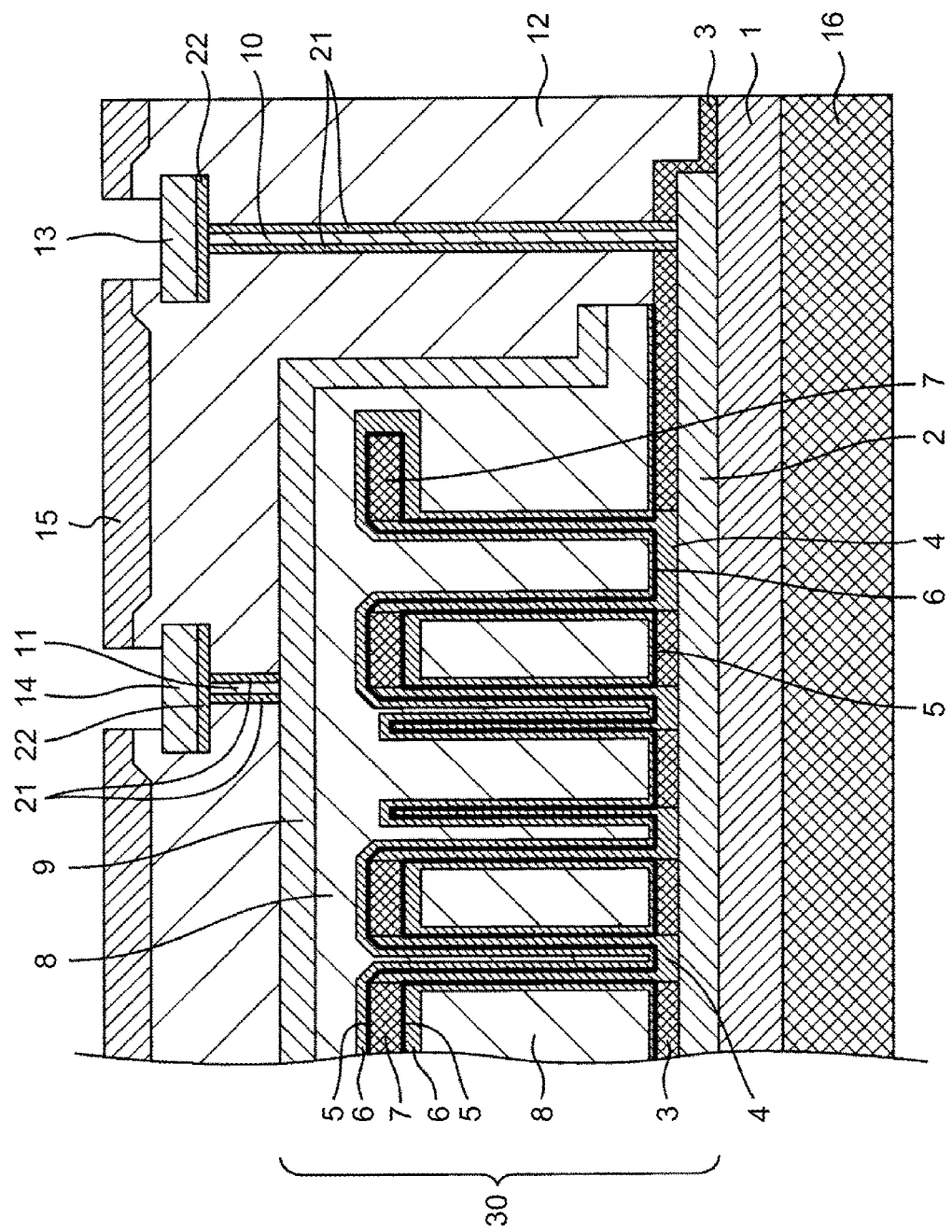
FIG. 13 is a cross-sectional view showing a tenth state in the manufacturing process of the capacitor device of FIG. 1.

FIG. 13 is a cross-sectional view showing a tenth state in the manufacturing process of the capacitor device of FIG. 1. In FIG. 13, via conductors 10 and 11 penetrating the interlayer oxide film 12 are formed, pad conductors 13 and 14 are formed on the interlayer oxide film 12, and a passivation film 15 is formed on the interlayer oxide film 12. In the passivation film 15, openings are formed only in the portions of the pad conductors 13 and 14. Prior art methods can be used to form via conductors 10 and 11. The via conductor 10 and the pad conductor 13 are electrically connected to the metal film 2 of the lower electrode and form at least one first cell terminal exposed on the upper surface. The via conductor 11 and the pad conductor 14 are electrically connected to the metal film 9 of the upper electrode and form at least one second cell terminal exposed on the upper surface. A barrier metal 21 is formed around the via conductors 10 and 11, and a barrier metal 22 is formed on the lower surfaces of the pad conductors 13 and 14.

Thereafter, the silicon substrate 16 is removed by backside polishing, whereby the capacitor device of FIG. 2 is completed.

Since the capacitor device according to the first embodiment does not use a silicon substrate in the portion of the capacitor cell 30, the capacitor device normally operates even if the silicon substrate 16 is removed by backside polishing. By removing the silicon substrate 16, the thickness of the capacitor device can be reduced as compared with the conventional case. The total thickness of the capacitor device according to the first embodiment can be reduced to about 4 to 5 μm when configured as a MIM crown type stack capacitor. However, this is not a limitation of the present invention. According to the present invention, the silicon substrate 16 may be kept intact, or the silicon substrate 16 may merely be thinned by the backside polishing polished such that a portion of silicon substrate 16 may left in the final product.

Further, as the structure of the stack capacitor, a concave (Concaved) stack MIM capacitor according to the prior art may be adopted.

An advantage of the MIM capacitor is that the desired capacitance can be secured without increasing the thickness of the capacitor device due to the effect of the high dielectric constant of the insulating film.

For example, by forming the MIM capacitor using a semiconductor process technology such as a general-purpose DRAM, it is possible to realize high density, thinning, and low cost. In general-purpose DRAM semiconductor process technology, a capacitor can be formed without using a structure formed below the surface of a silicon substrate like a trench capacitor, and is very suitable for thinning the capacitor device itself. Furthermore, process development costs can be reduced by diverting general-purpose DRAM semiconductor process technology.

Second Embodiment

Figure 14:
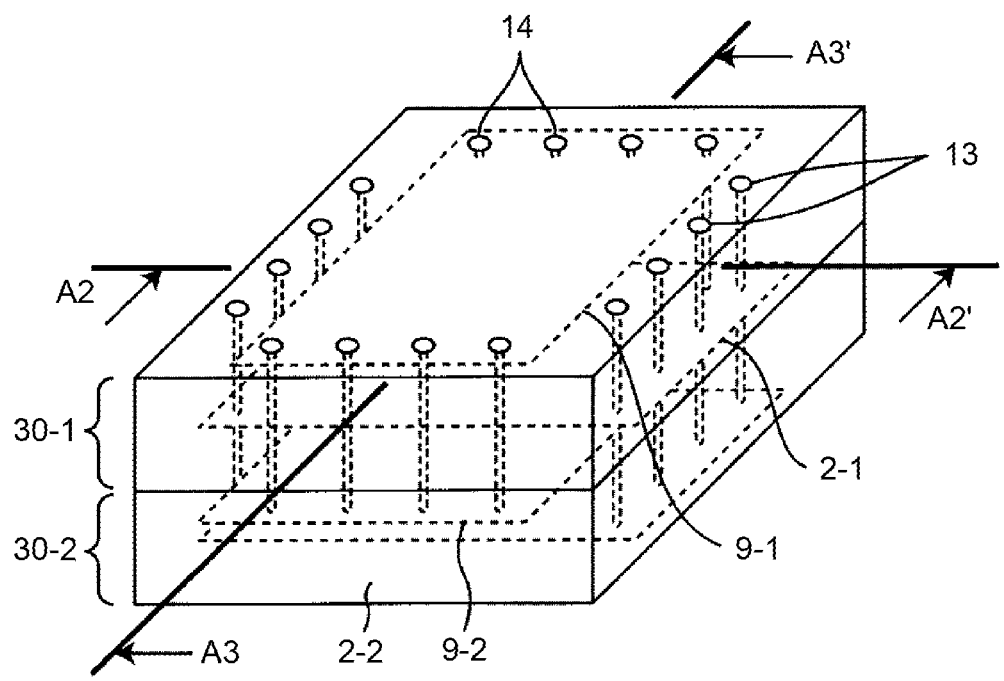
FIG. 14 is a perspective view showing a configuration of a capacitor device according to a second embodiment.

FIG. 14 is a perspective view showing the configuration of the capacitor device according to the second embodiment. The capacitor device of FIG. 14 is configured similarly to the capacitor cell 30 of the capacitor device according to the first embodiment, and a plurality of capacitor cells 30-1 stacked in a direction perpendicular to the lower surface and the upper surface of the semiconductor substrate. And 30-2. At least one first cell terminal including the pad conductor 13 is electrically connected to the lower electrode including the metal film 2-1 in the capacitor cell 30-1, and further, the metal film 2-in the capacitor cell 30-2. 2 is electrically connected to the lower electrode. At least one second cell terminal including the pad conductor 14 is electrically connected to the upper electrode including the metal film 9-1 in the capacitor cell 30-1, and further, the metal film 9-2 in the capacitor cell 30-2.

Figure 15:
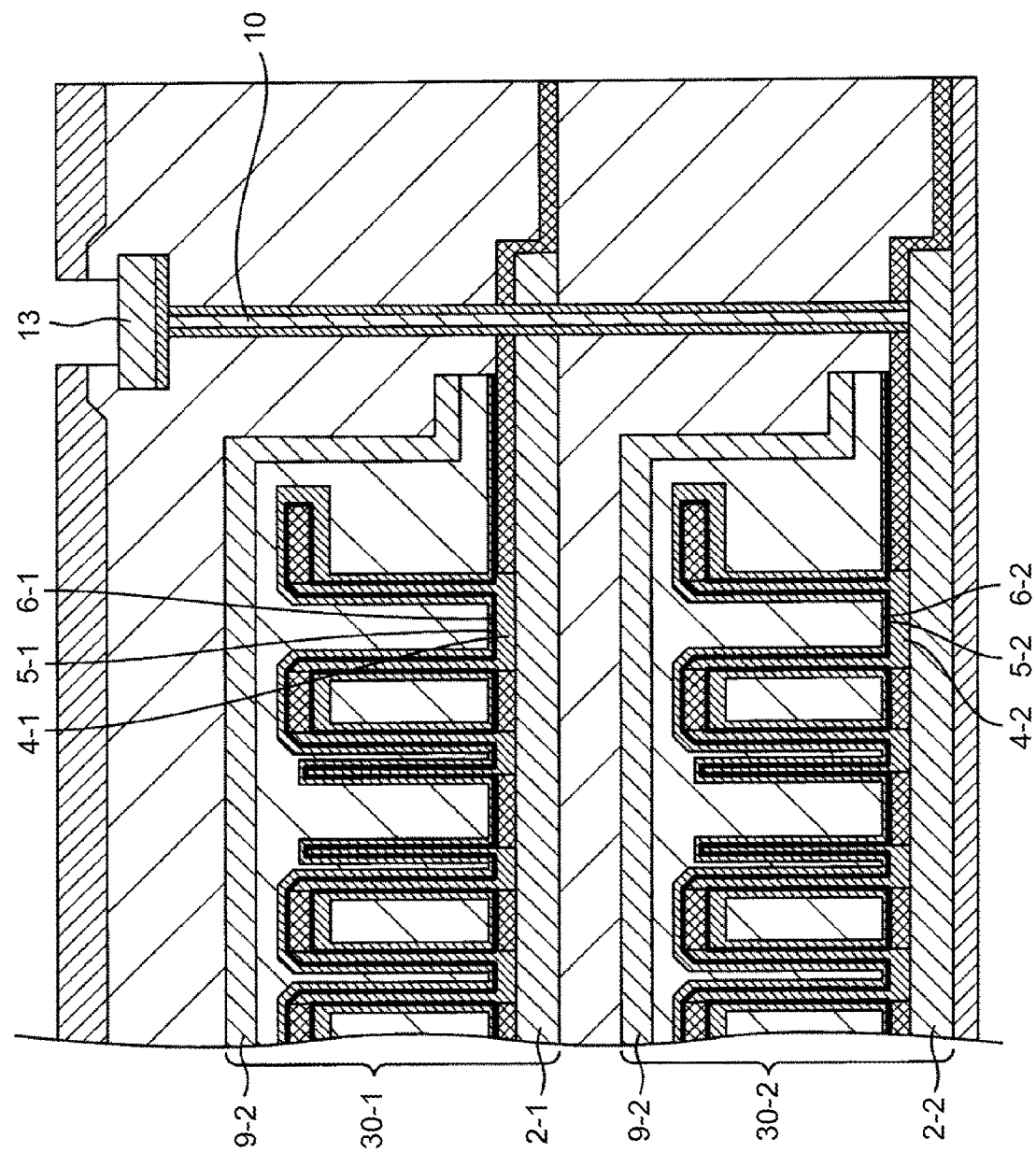
FIG. 15 is a diagram showing a part of a longitudinal section taken along line A2-A2' of the capacitor device of FIG. 12.
Figure 16:
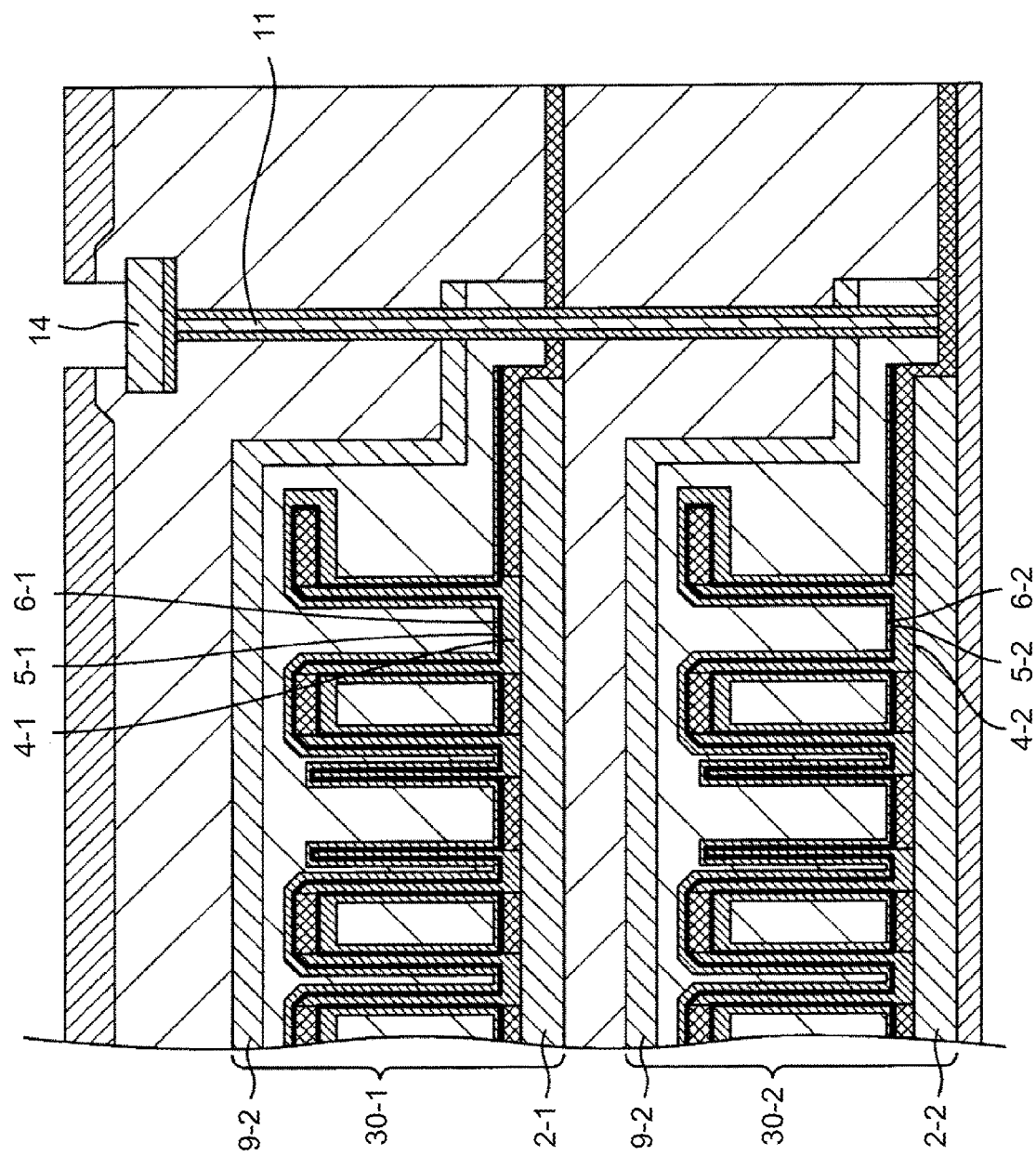
FIG. 16 is a diagram showing a part of a longitudinal section taken along line A3-A3' of the capacitor device of FIG. 13.

FIG. 15 is a view showing a part of a longitudinal section taken along line A2-A2' of the capacitor device of FIG. 14. FIG. 16 is a view showing a part of a longitudinal section taken along line A3-A3' of the capacitor device of FIG. 14. The capacitor device of FIG. 14 forms the capacitor cell 30 in FIG. 11, forms the interlayer oxide film 12 in FIG. 12 and planarizes the upper surface, and then repeats the steps described with reference to FIG. 4 to FIG. 12. Repeatedly, another capacitor cell 30 is formed. Thus, a plurality of capacitor cells 30-1 and 30-2 are formed that are stacked in a direction perpendicular to the lower surface and the upper surface of the semiconductor substrate. After forming the second capacitor cell 30, the silicon substrate 16 is removed by backside polishing. Next, the via conductor 10 is electrically connected to the metal film 2-1 of the lower electrode in the capacitor cell 30-1, and further electrically connected to the metal film 2-2 of the lower electrode in the capacitor cell 30-2. It is formed to be connected. Accordingly, the first cell terminal including the via conductor 10 and the pad conductor 13 is connected to the lower electrodes of the plurality of capacitor cells 30-1 and 30-2. Via conductor 11 is electrically connected to metal film 9-1 of the upper electrode in capacitor cell 30-1, and is further electrically connected to metal film 9-2 of the upper electrode in capacitor cell 30-2. Accordingly, the second cell terminal including the via conductor 11 and the pad conductor 14 is connected to the upper electrodes of the plurality of capacitor cells 30-1 and 30-2.

Figure 17:
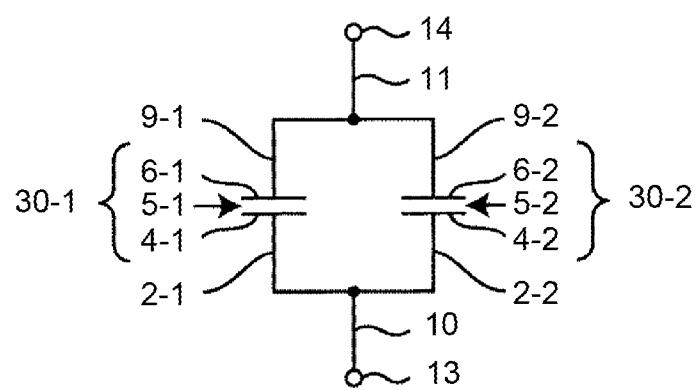
FIG. 17 is a circuit diagram showing an equivalent circuit of the capacitor device of FIGS. 15 and 16.

FIG. 17 is a circuit diagram showing an equivalent circuit of the capacitor device of FIGS. 15 and 16. In the capacitor cell 30-1, the conductor films 4-1 and 6-1 are capacitively coupled to each other through the insulating film 5-1. The conductor film 4-1 is electrically connected to the pad conductor 13 through the metal film 2-1 and the via conductor 10. The conductor film 6-1 is electrically connected to the pad conductor 14 via doped silicon (not shown), the metal film 9-1, and the via conductor 11. Similarly, in the capacitor cell 30-2, the conductor films 4-2 and 6-2 are capacitively coupled to each other through the insulating film 5-2. The conductor film 4-2 is electrically connected to the pad conductor 13 through the metal film 2-2 and the via conductor 10. The conductor film 6-2 is electrically connected to the pad conductor 14 via doped silicon (not shown), the metal film 9-2, and the via conductor 11. Thereby, the capacitor cells 30-1 and 30-2 are connected in parallel between the pad conductors 13 and 14.

In the capacitor device according to the second embodiment, the capacitor cells 30-1 and 30-2 are stacked and connected in parallel, so that the area of the capacitor cell in the horizontal direction is not increased. The capacity can be doubled.

By repeating the steps of FIGS. 4 to 13 and stacking three or more capacitor cells and connecting them in parallel, it is possible to increase the capacitance three times or more compared to the case of the first embodiment. In that case, the via conductors 10 and 11 may be formed using, for example, a conventional TSV (Through Si Via) technique.

Also in the capacitor device according to the second embodiment, the thickness of the capacitor device can be reduced as compared with the conventional case by removing the silicon substrate, similarly to the capacitor device according to the first embodiment. The total thickness of the capacitor device according to the second embodiment is only about 6 to 7 μm when configured as a MIM crown type stack capacitor.

The capacitor device according to the second embodiment also has other advantages similar to those of the capacitor device according to the first embodiment.

Third Embodiment

Figure 18:
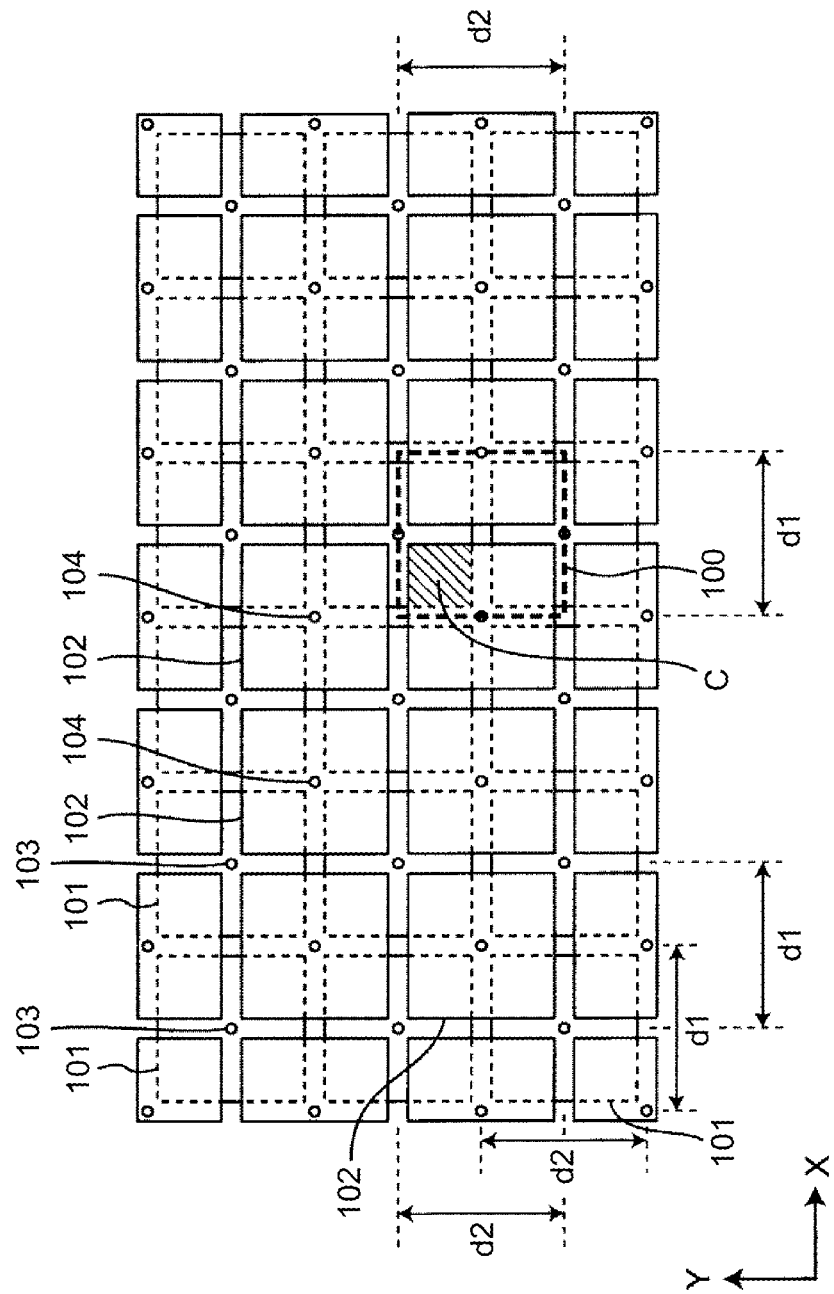
FIG. 18 is a top view showing a capacitor device according to a third embodiment in a state where no external terminal is formed.

FIG. 18 is a top view showing the capacitor device according to the third embodiment, in which no external terminal is formed. The capacitor device of FIG. 18 includes a plurality of capacitor cells C formed on a rectangular semiconductor substrate having sides extending along a first direction and a second direction orthogonal to each other.

FIG. 18 includes a plurality of lower electrodes 101, a plurality of upper electrodes 102, a plurality of cell terminals 103, and a plurality of cell terminals 104 formed on a semiconductor substrate. Each lower electrode 101, each upper electrode 102, each cell terminal 103, and each cell terminal 104 are the lower electrode, the upper electrode, the first cell terminal, and the second electrode of the capacitor device according to the first embodiment. It corresponds to each cell terminal. Each lower electrode 101, each upper electrode 102, each cell terminal 103, and each cell terminal 104 are formed on a semiconductor substrate including an oxide film, as in the capacitor device according to the first embodiment. After FIG. 18, the semiconductor substrate is omitted for simplification of illustration.

In this specification, the X direction in FIG. 18 or the like is also referred to as a first direction, and the Y direction is also referred to as a second direction. Further, in this specification, each lower electrode 101, each upper electrode 102, each cell terminal 103, and each cell terminal 104 is referred to as a first electrode, a second electrode, a first cell terminal, and a second cell terminal. Also called a cell terminal.

The plurality of lower electrodes 101 includes a portion (for example, a portion corresponding to the metal film 2 in FIG. 2) formed in the first layer of the semiconductor substrate, and is disposed at the first period d1 in the X direction. Arranged in the direction with a second period d2. The plurality of upper electrodes 102 include a portion (for example, a portion corresponding to the metal film 9 in FIG. 2) formed in a second layer different from the first layer of the semiconductor substrate, and is arranged with a period d1 in the X direction, and arranged with a period d2 in the Y direction. Each upper electrode 102 is arranged so as to be shifted from the lower electrode 101 by a half of the length of the period d1 in the X direction, and is shifted by a half of the length of the period d2 in the Y direction.

Each lower electrode 101 and each upper electrode 102 are partly opposed and capacitively coupled to each other, and each pair of lower electrode 101 and upper electrode 102 that are capacitively coupled to each other form a capacitor cell C.

The plurality of cell terminals 103 includes a portion formed in a third layer different from the first and second layers of the semiconductor substrate, and is arranged with a period d1 in the X direction and with a period d2 in the Y direction. The plurality of lower electrodes 101 are electrically connected to each other. At this time, the second layer is located between the first and third layers. The plurality of cell terminals 104 include a portion formed in the third layer of the semiconductor substrate, and are arranged with a period d1 in the X direction and with a period d2 in the Y direction, and are electrically connected to the plurality of upper electrodes 102, respectively. Each cell terminal 104 is arranged so as to be shifted from the cell terminal 103 by half the length of the period d1 in the X direction, and is shifted by half the length of the period d2 in the Y direction.

In other words, the capacitor device includes two lower electrodes 101 adjacent to each other in the Y direction and two upper electrodes 102 adjacent to each other in the X direction (or two lower electrodes 101 adjacent to each other in the X direction; A plurality of unit cells 100 (including two upper electrodes 102 adjacent to each other in the Y direction) are included. Each unit cell 100 includes four capacitor cells C formed from a pair of lower electrode 101 and upper electrode 102 that are capacitively coupled to face each other. Capacitor cells C having a desired number of rows and columns are formed by repeatedly arranging a plurality of unit cells 100.

The capacitor device according to the third embodiment may be configured similarly to the capacitor device according to the first embodiment. In this case, the semiconductor substrate has a first surface and a second surface. The capacitor device includes a first silicon oxide film exposed on the first surface and a passivation film exposed on the second surface. Each lower electrode 101 is formed on the first silicon oxide film and includes a plurality of stacked conductor films. Each upper electrode 102 includes a plurality of stacked conductor films. The capacitor device further includes an insulating film formed between each lower electrode 101 and each upper electrode 102 and a second silicon oxide film formed on each upper electrode 102. The passivation film is formed on the second silicon oxide film. Cell terminals 103 and 104 are exposed on the second surface. Each capacitor cell C is formed of a pair of lower electrode 101 and upper electrode 102 that are capacitively coupled to face each other, and an insulating film formed therebetween.

Each capacitor cell C may be formed as a crown type stack capacitor.

Each of the cell terminals 103 and 104 may be configured similarly to the first and second cell terminals of the capacitor device according to the first embodiment. In this case, each cell terminal 103 is electrically connected to the first pad conductor formed on the third layer of the semiconductor substrate and one of the plurality of lower electrodes 101 from the first pad conductor. Similarly, each cell terminal 104 is electrically connected to a second pad conductor formed on the third layer of the semiconductor substrate and one of the plurality of upper electrodes 102 from the second pad conductor.

Figure 19:
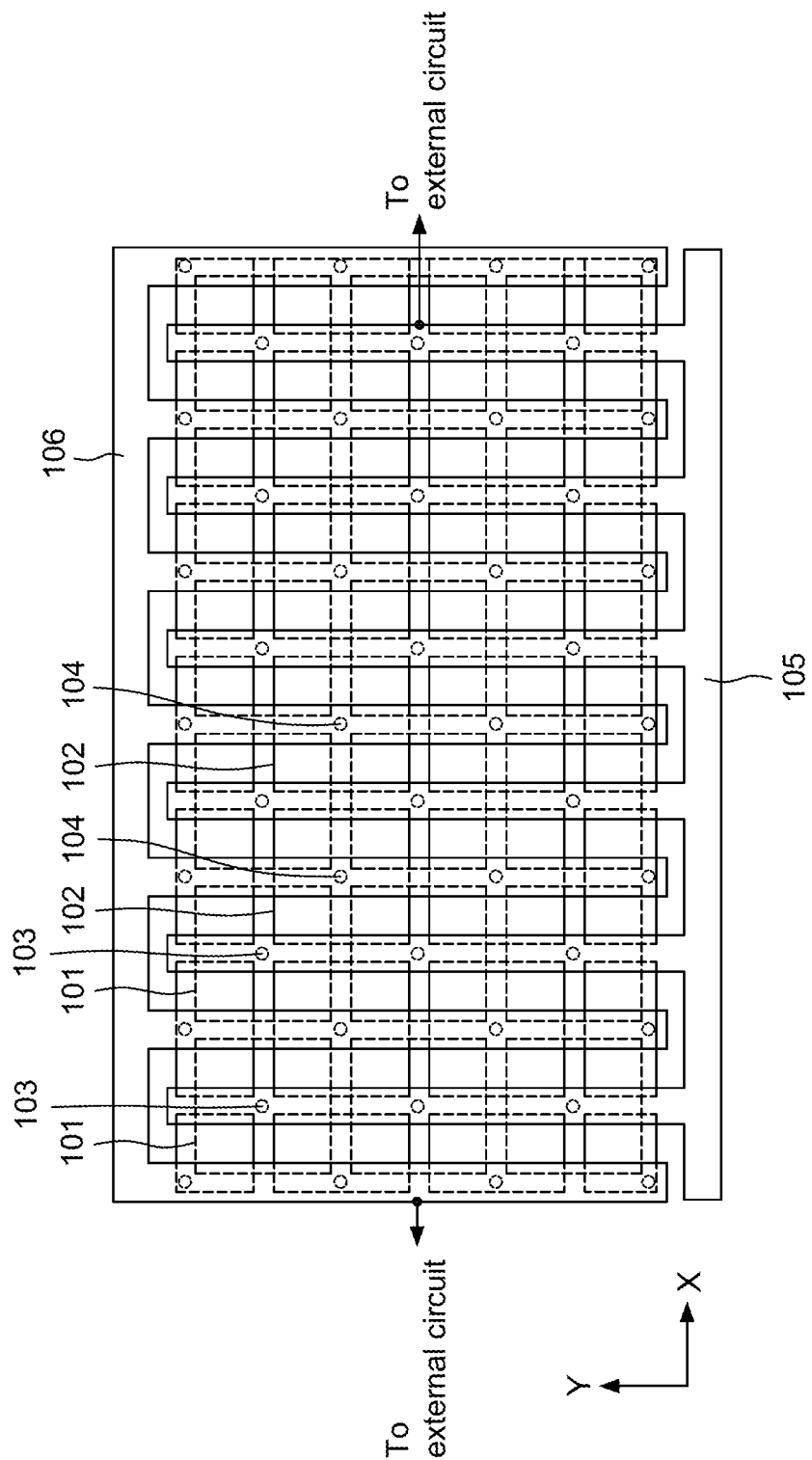
FIG. 19 is a top view showing a capacitor device according to a third embodiment in which external terminals 105 and 106 are formed in the capacitor device of FIG. 18.

FIG. 19 is a top view showing the capacitor device according to the third embodiment, in which external terminals 105 and 106 are formed in the capacitor device of FIG. 18. The capacitor device further includes at least two external terminals 105 and 106 for electrical connection to a circuit external to the capacitor device. Each external terminal 105 and 106 is electrically connected to a part of the plurality of cell terminals including the plurality of cell terminals 103 and the plurality of cell terminals 104, respectively.

The plurality of cell terminals 103 and 104 extend in the Y direction, and form a plurality of cell terminal rows adjacent to each other in the extending direction.

In the example of FIG. 19, the capacitor device includes external terminals 105 and 106 each having a comb shape. The external terminal 105 includes a plurality of first portions (portions extending in the Y direction) electrically connected to every 2N cell terminal rows of the plurality of cell terminal rows when N is an integer, and a second portion (a portion extending in the X direction) that connects the first portions to each other. The external terminal 106 also includes a plurality of first portions (portions extending in the Y direction) electrically connected to every 2N cell terminal rows of the plurality of cell terminal rows, and a first portion, and a second portion (a portion extending in the X direction) connected to each other. Each first portion of the external terminal 105 and each first portion of the external terminal 106 are formed so as to be fitted to each other. Each of the external terminals 105 and 106 is arranged such that every N cell terminal rows of the plurality of cell terminal rows are electrically connected to the external terminals 105 and 106 alternately.

FIG. 19 shows a case where N=1. Accordingly, the external terminal 105 is electrically connected to every two cell terminal rows of the plurality of cell terminal rows, and the external terminal 106 is also connected to every two cell terminal rows of the plurality of cell terminal rows. Is electrically connected. Each of the external terminals 105 and 106 is arranged such that a plurality of cell terminal arrays are alternately electrically connected to the external terminals 105 and 106.

The external terminals 105 and 106 can be connected to a voltage source having an arbitrary voltage. For example, one of them may be connected to a power source and the other may be grounded.

The external terminals 105 and 106 are electrically connected to a circuit external to the capacitor device at a portion electrically connected to one of the plurality of cell terminal rows (that is, each first portion of the external terminals 105 and 106). Instead, the external terminals 105 and 106 may be electrically connected to a circuit outside the capacitor device in their respective second portions (portions extending in the X direction).

Figure 20:
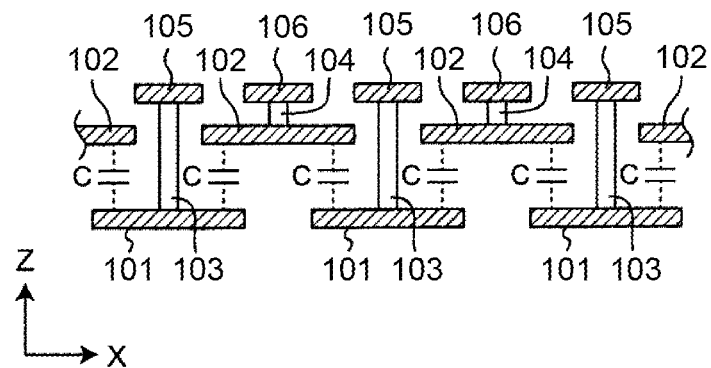
FIG. 20 is a circuit diagram showing an equivalent circuit of the capacitor device of FIG. 18.

FIG. 20 is a circuit diagram showing an equivalent circuit of the capacitor device of FIG. 18. As described above, each capacitor cell C is formed between each pair of the lower electrode 101 and the upper electrode 102 that are capacitively coupled to face each other. According to FIG. 20, one capacitor cell C is formed between the external terminals 105 and 106 adjacent to each other. Therefore, in the entire capacitor device, a plurality of capacitor cells C are connected in parallel.

Figure 21:
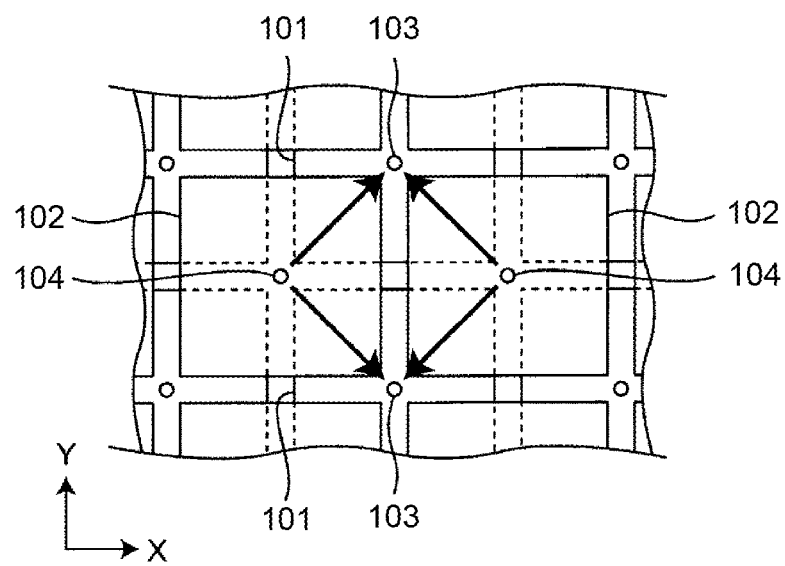
FIG. 21 is a schematic diagram showing a current flowing through the capacitor device of FIG. 18.

FIG. 21 is a schematic diagram showing a current flowing through the capacitor device of FIG. 18. In FIG. 21, the external terminals 105 and 106 are omitted. For example, when the external terminal 106 (and hence the cell terminal 104) is connected to the power supply and the external terminal 105 (and hence the cell terminal 103) is grounded, a current flows in the direction of the arrow. In order to reduce the equivalent series inductance (ESL), it is effective to lay out the components of the capacitor device so that the currents through the capacitor device cancel each other. As shown in FIG. 21, the equivalent series inductance can be reduced by arranging each lower electrode 101, each upper electrode 102, each cell terminal 103, and each cell terminal 104 periodically and symmetrically. As shown in FIG. 19, the equivalent series inductance is best reduced when a fine pitch bump is formed in a portion where the external terminals 105 and 106 are electrically connected to one of the plurality of cell terminal rows.

The period d1 in which each lower electrode 101, each upper electrode 102, each cell terminal 103, and each cell terminal 104 are arranged in the X direction and the period d2 in which each cell terminal 104 is arranged in the Y direction may be set to be equal to each other. FIG. 18 shows a case where d1=d2, for example.

Figure 22:
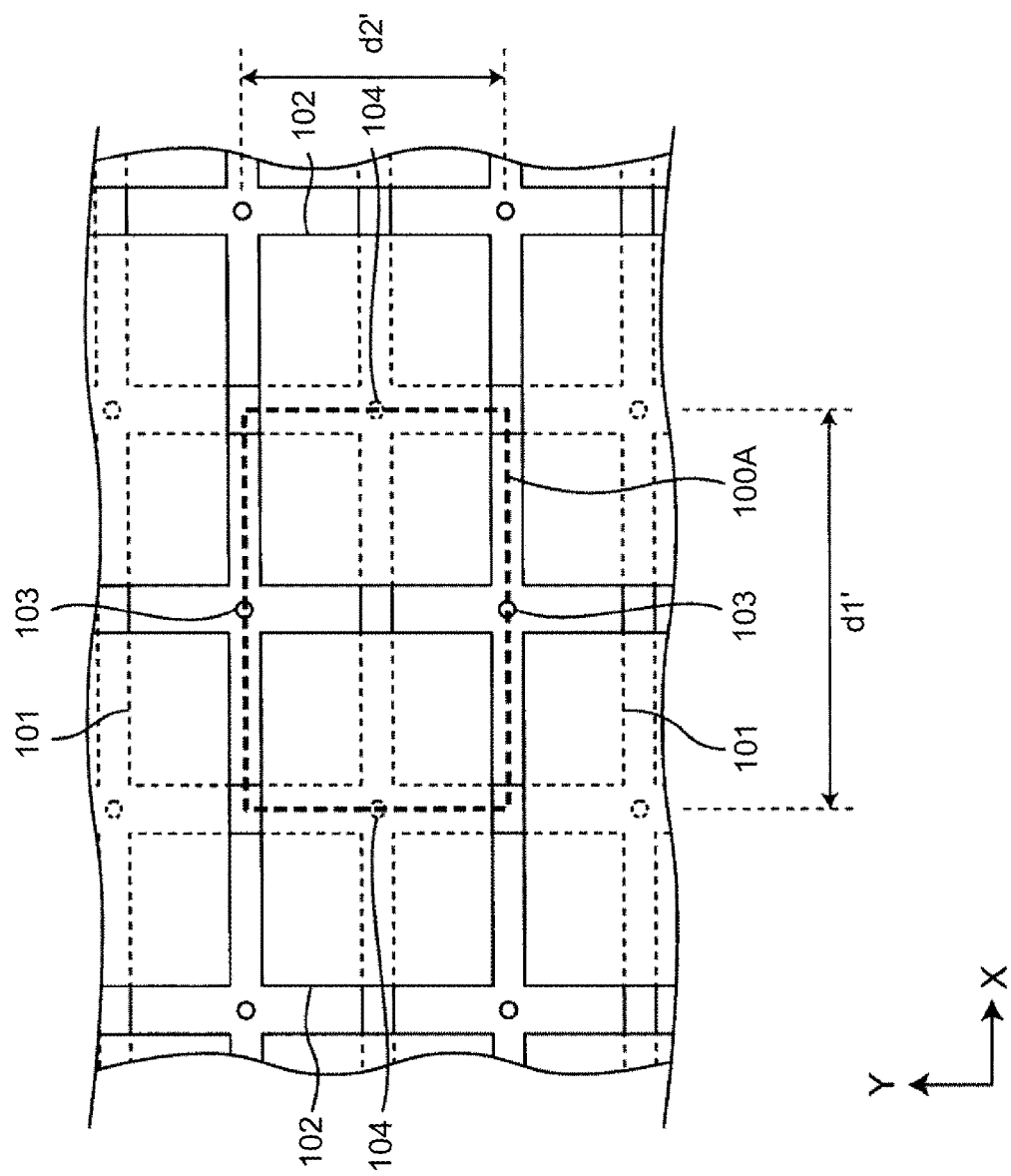
FIG. 22 is a top view showing a part of a capacitor device according to a modification of the third embodiment and showing a state in which no external terminal is formed.

FIG. 22 is a top view showing a part of a capacitor device according to a modification of the third embodiment and showing a state in which no external terminal is formed. In the example of FIG. 22, the period d1' in which the upper electrodes 102, the cell terminals 103, and the cell terminals 104 are arranged in the X direction and the period d2' in the Y direction are set to be different from each other. The unit cell 100A includes two lower electrodes 101 adjacent in the Y direction and two upper electrodes 102 adjacent in the X direction. The capacitor device of FIG. 22 can also operate in the same manner as the capacitor device of FIG. 18.

According to the capacitor device according to the third embodiment, a capacitor device having characteristics such as a different capacitance, a different capacitance density, a different breakdown voltage, and/or a different position and number of terminals from the capacitor device of FIG. 19. In this case, only a mask for forming the external terminals 105 and 106 may be replaced as described in the following embodiments. In order to form a plurality of capacitor cells C, a plurality of expensive masks are required. According to the capacitor device according to the third embodiment, when customizing the capacitor device according to customer requirements, by changing only one (or a small number) of relatively inexpensive masks, the external terminals 105 and 106 can be changed. The shape can be changed, whereby the characteristics of the capacitor described above can be changed. At this time, it is not necessary to change the mask for forming the plurality of capacitor cells C. As described above, according to the capacitor device according to the third embodiment, it is possible to manufacture the capacitor device by changing the characteristics of the capacitor described above at a lower cost than before.

Fourth Embodiment

Figure 23:
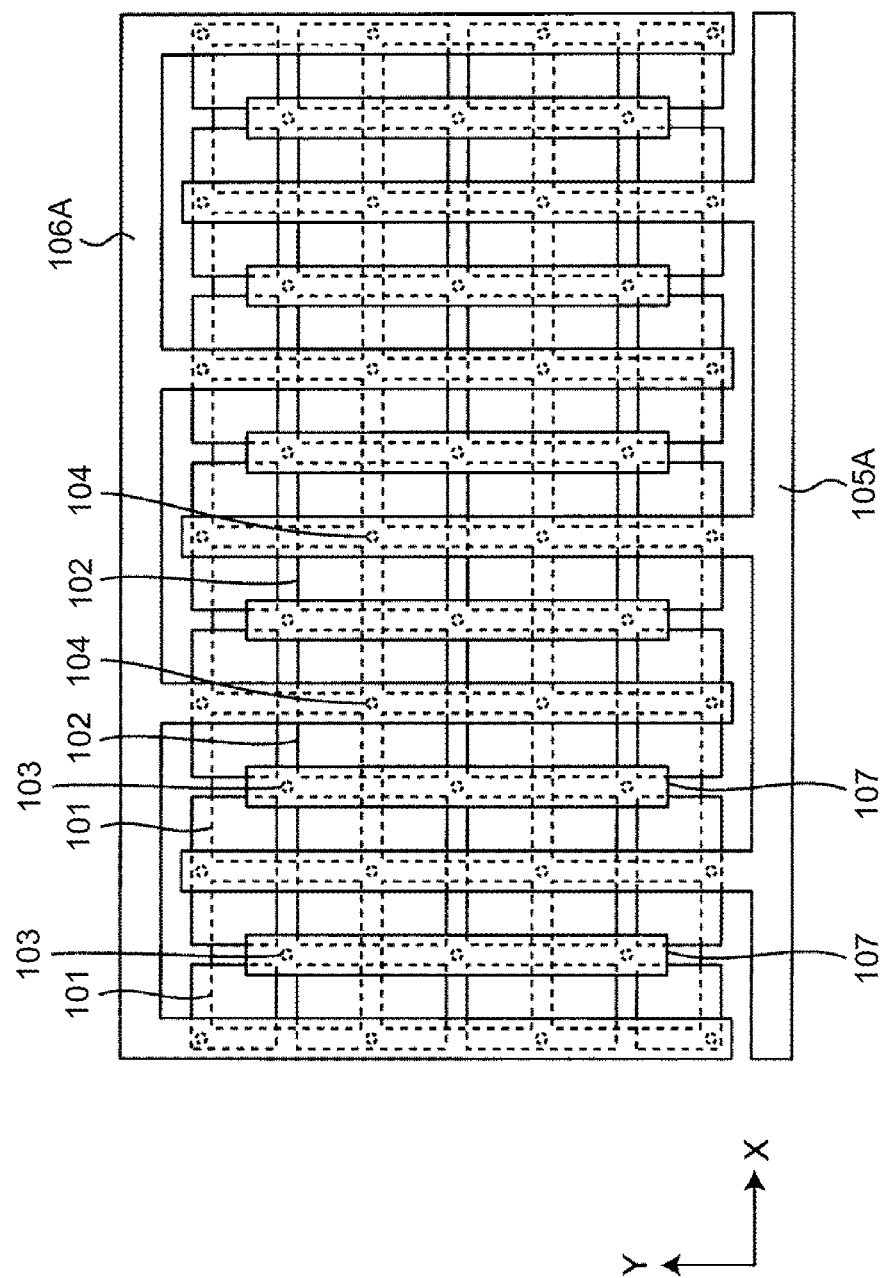
FIG. 23 is a top view showing a configuration of a capacitor device according to a fourth embodiment.

FIG. 23 is a top view showing the configuration of the capacitor device according to the fourth embodiment. The capacitor device of FIG. 23 includes external terminals 105A and 106A each having a comb shape. FIG. 23 shows a case where N=2. Accordingly, the external terminals 105A extend in the Y direction and are electrically connected to every four cell terminal rows of the plurality of adjacent cell terminal rows, and the external terminal 106A is also a plurality of cell terminals. It is electrically connected to every four cell terminal rows in the row. Each of the external terminals 105A and 106A is arranged such that every two cell terminal rows of the plurality of cell terminal rows are electrically connected to the external terminals 105A and 106A alternately.

The capacitor device of FIG. 23 further includes a plurality of floating terminals 107 that are electrically connected to the cell terminal row including the cell terminals 103 that are not connected to the external terminals 105A and 106A, due to the convenience of the semiconductor process technology. Each floating terminal 107 is not connected to other circuits.

Figure 24:
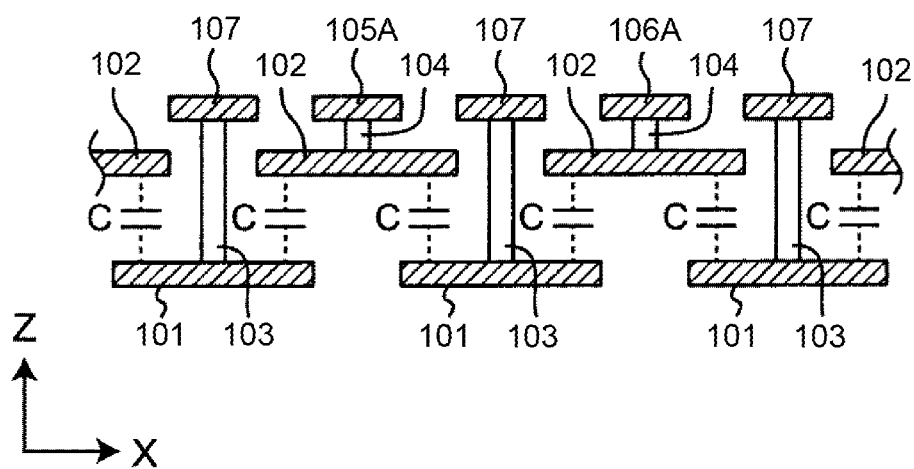
FIG. 24 is a circuit diagram showing an equivalent circuit of the capacitor device of FIG. 23.

FIG. 24 is a circuit diagram showing an equivalent circuit of the capacitor device of FIG. 23. According to FIG. 24, two capacitor cells C are formed between the external terminals 105A and 106A adjacent to each other. Therefore, in the entire capacitor device, a plurality of circuits each including two capacitor cells C connected in series are connected in parallel.

Fifth Embodiment

Figure 25:
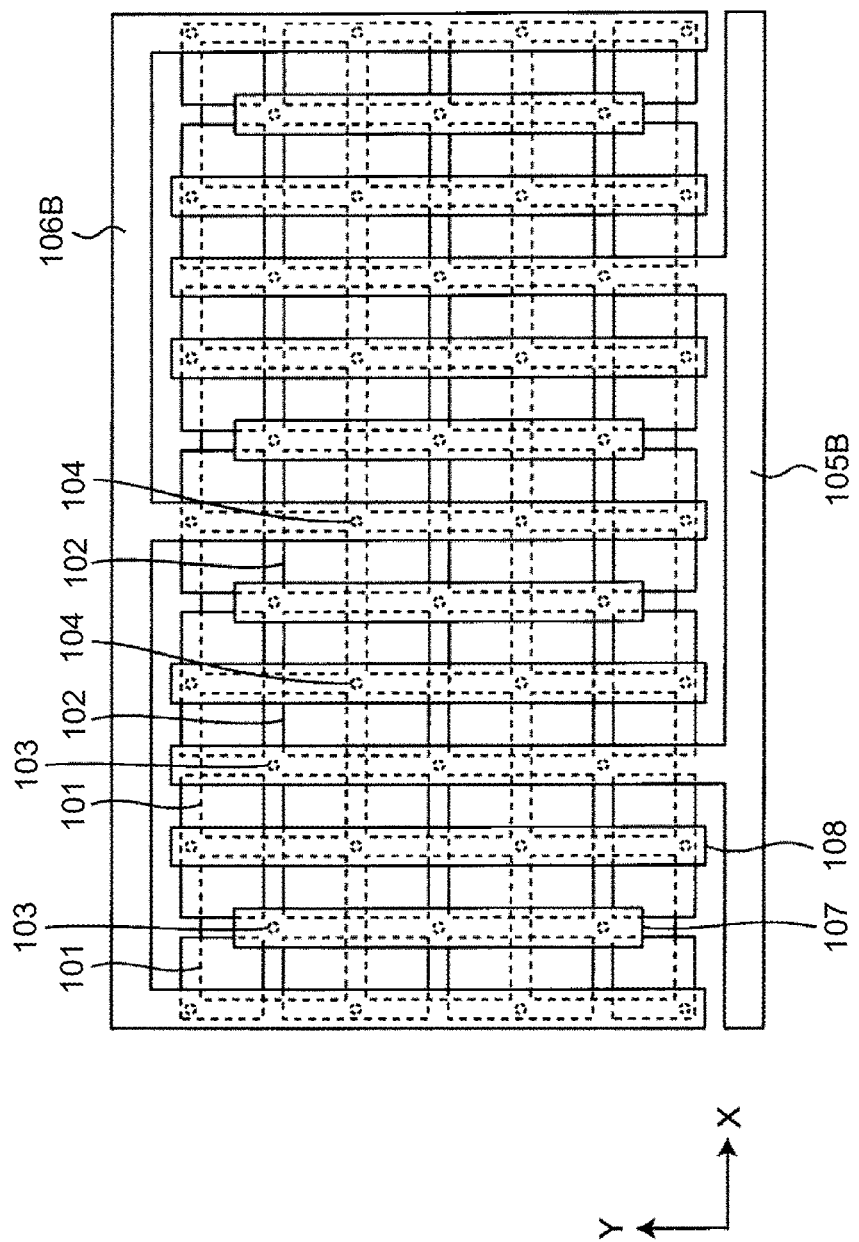
FIG. 25 is a top view showing a configuration of a capacitor device according to a fifth embodiment.

FIG. 25 is a top view showing the configuration of the capacitor device according to the fifth embodiment. The capacitor device of FIG. 25 includes external terminals 105B and 106B each having a comb shape. FIG. 25 shows a case where N=3. Accordingly, the external terminals 105B extend in the Y direction and are electrically connected to every six cell terminal rows among the plurality of adjacent cell terminal rows, and the external terminal 106B also has a plurality of cell terminals. It is electrically connected to every six cell terminal rows in the row. Each of the external terminals 105B and 106B is arranged such that every three cell terminal rows of the plurality of cell terminal rows are electrically connected to the external terminals 105B and 106B alternately.

The capacitor device of FIG. 25 further includes a plurality of floating terminals 107 and 108 that are electrically connected to cell terminal rows that are not connected to the external terminals 105B and 106B, respectively, for the convenience of semiconductor process technology. Each floating terminal 107 is electrically connected to a cell terminal row including cell terminals 103, and each floating terminal 108 is electrically connected to a cell terminal row including cell terminals 104. Each floating terminal 107 and 108 is not connected to other circuits.

Figure 26:
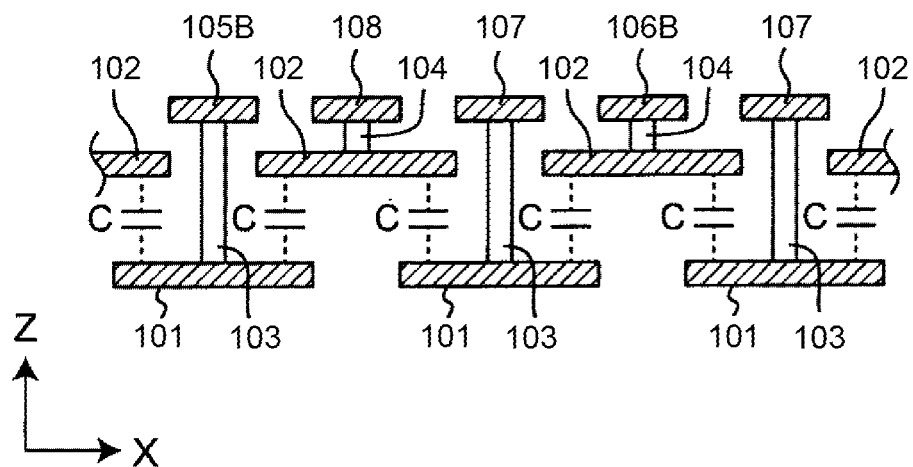
FIG. 26 is a circuit diagram showing an equivalent circuit of the capacitor device of FIG. 25.

FIG. 26 is a circuit diagram showing an equivalent circuit of the capacitor device of FIG. 25. According to FIG. 26, three capacitor cells C are formed between the external terminals 105B and 106B adjacent to each other. Therefore, in the entire capacitor device, a plurality of circuits each including three capacitor cells C connected in series are connected in parallel.

Sixth Embodiment

Figure 27:
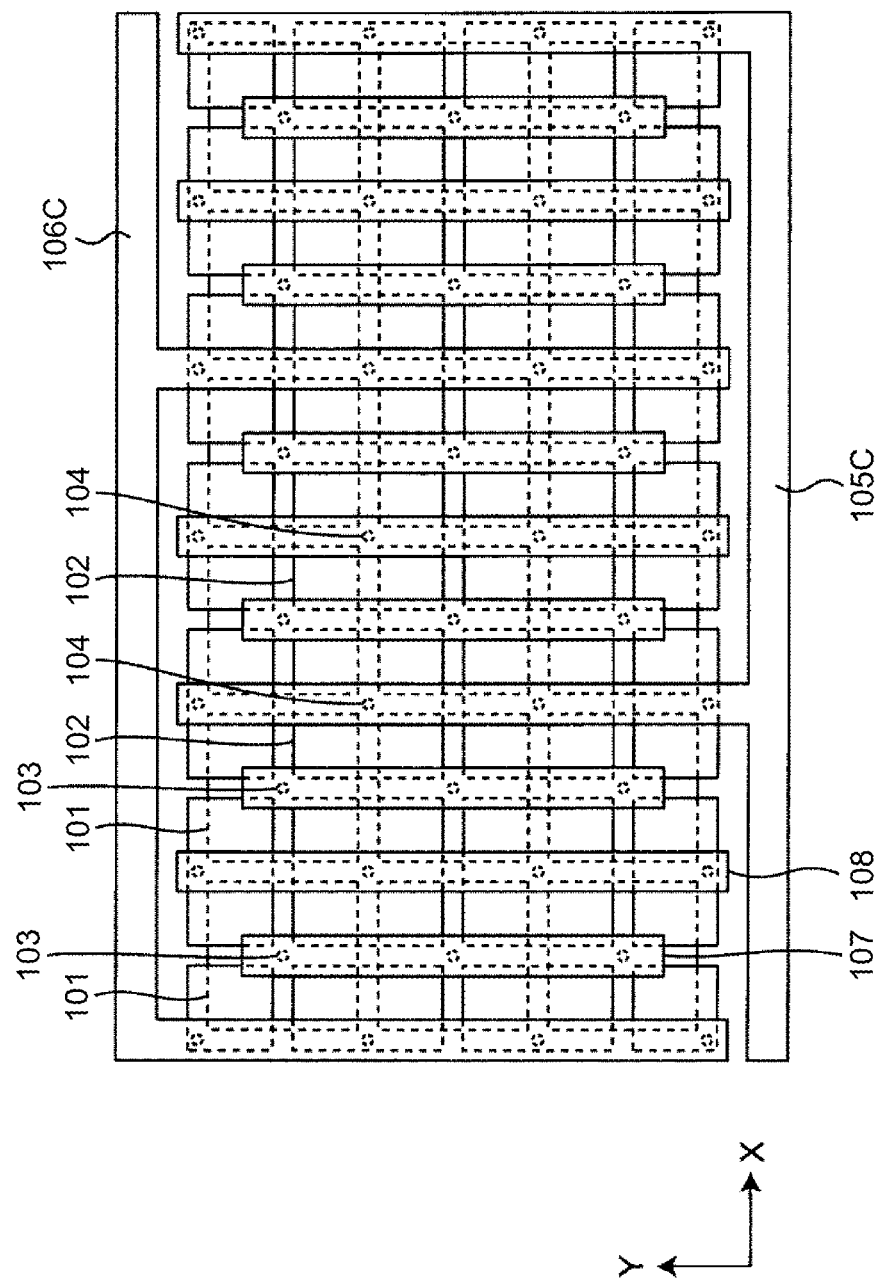
FIG. 27 is a top view showing a configuration of a capacitor device according to a sixth embodiment.

FIG. 27 is a top view showing the configuration of the capacitor device according to the sixth embodiment. The capacitor device of FIG. 27 includes external terminals 105C and 106C each having a comb shape. FIG. 27 shows a case where N=4. Therefore, the external terminal 105C extends in the Y direction and is electrically connected to every eight cell terminal rows of the plurality of adjacent cell terminal rows, and the external terminal 106C is also a plurality of cell terminals. It is electrically connected to every eight cell terminal rows in the row. Each of the external terminals 105C and 106C is arranged such that every four cell terminal rows of the plurality of cell terminal rows are electrically connected to the external terminals 105C and 106C alternately.

The capacitor device of FIG. 27 further includes a plurality of floating terminals 107 and 108 that are electrically connected to cell terminal rows that are not connected to the external terminals 105C and 106C, respectively, due to the convenience of semiconductor process technology. Each floating terminal 107 is electrically connected to a cell terminal row including cell terminals 103, and each floating terminal 108 is electrically connected to a cell terminal row including cell terminals 104. Each floating terminal 107 and 108 is not connected to other circuits.

Figure 28:
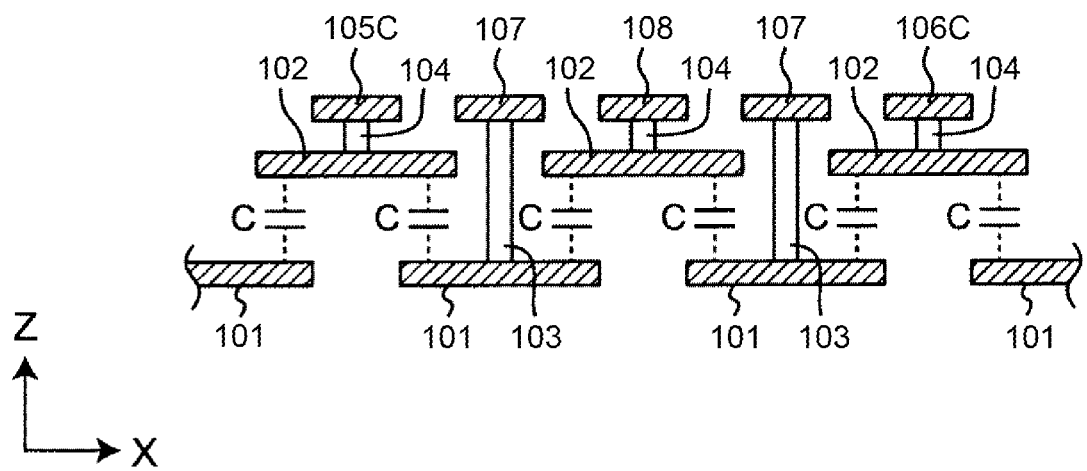
FIG. 28 is a circuit diagram showing an equivalent circuit of the capacitor device of FIG. 27.

FIG. 28 is a circuit diagram showing an equivalent circuit of the capacitor device of FIG. 27. According to FIG. 28, four capacitor cells C are formed between the external terminals 105C and 106C adjacent to each other. Therefore, in the entire capacitor device, a plurality of circuits each including four capacitor cells C connected in series are connected in parallel.

Similarly to the capacitor devices according to the third to sixth embodiments, when N is an integer equal to or greater than 5, a pair of external terminals includes a pair of cell terminal rows every N of the plurality of cell terminal rows. The position may be arranged so that it may be electrically connected to an external terminal alternately.

According to the capacitor devices according to the third to sixth embodiments, the number of capacitor cells C connected in series can be changed by changing the shape of the external terminal. The number of capacitor cells C connected in series is inversely proportional to the capacity density and breakdown voltage of the capacitor device. By changing only the mask for the external terminals according to customer requirements, a capacitor device having an optimum capacity density and withstand voltage can be manufactured at low cost.

Seventh Embodiment

Figure 29:
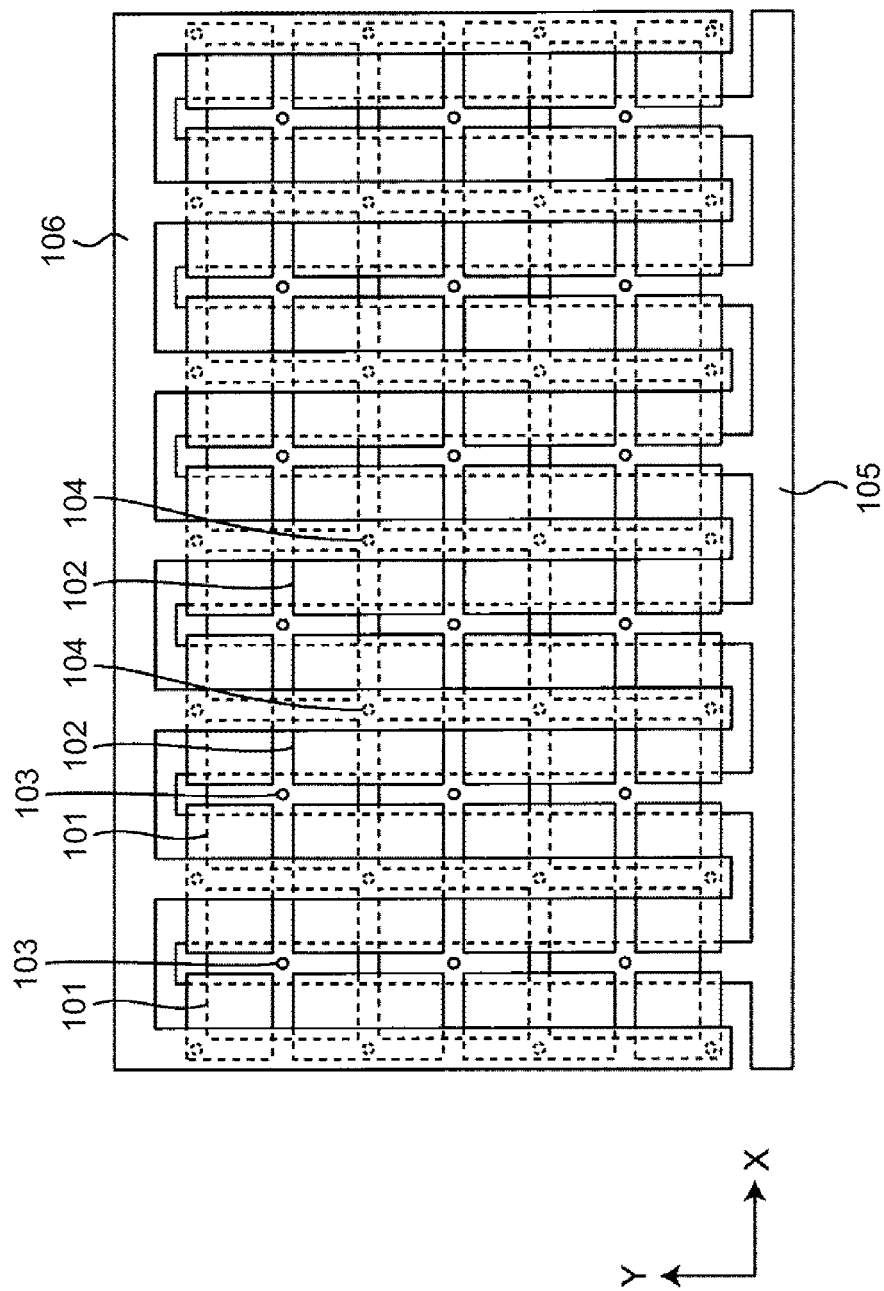
FIG. 29 is a top view showing a configuration of a capacitor device according to a seventh embodiment.

FIG. 29 is a top view showing the configuration of the capacitor device according to the seventh embodiment. The plurality of external terminals 105 and 106 are not limited to being formed in the same layer. In the capacitor device of FIG. 29, the external terminal 105 is formed below the lower electrode 101, and the external terminal 106 is formed above the upper electrode 102. The capacitor device according to the seventh embodiment can also operate in the same manner as the capacitor device according to the third embodiment.

Eighth Embodiment

Figure 30:
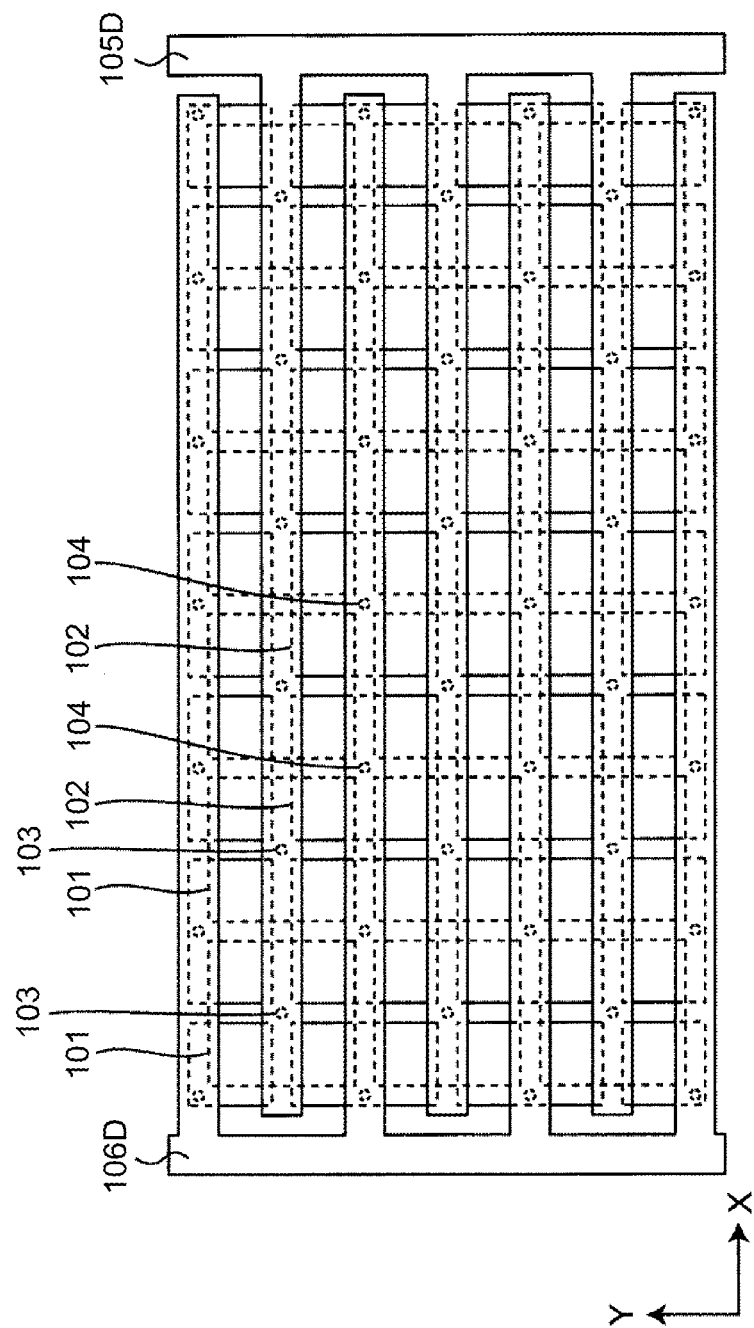
FIG. 30 is a top view showing a configuration of a capacitor device according to an eighth embodiment.

FIG. 30 is a top view showing the configuration of the capacitor device according to the eighth embodiment. The plurality of cell terminals 103 and 104 extend in the X direction and are adjacent to each other in the extending direction instead of the cell terminal rows extending in the Y direction as in the third to seventh embodiments. The cell terminal array may be formed.

In the example of FIG. 30, the capacitor device includes external terminals 105D and 106D each having a comb shape. The external terminal 105D has a plurality of first portions (portions extending in the X direction) electrically connected to every 2N cell terminal rows of the plurality of cell terminal rows when N is an integer, and a second portion (a portion extending in the Y direction) that connects the first portions to each other. The external terminal 106D also includes a plurality of first portions (portions extending in the X direction) electrically connected to every 2N cell terminal rows of the plurality of cell terminal rows, and a first portion, and a second portion (a portion extending in the Y direction) connected to each other. Each first portion of the external terminal 105D and each first portion of the external terminal 106D are formed so as to be fitted to each other. Each of the external terminals 105D and 106D is arranged such that every N cell terminal rows of the plurality of cell terminal rows are electrically connected to the external terminals 105D and 106D alternately.

FIG. 30 shows a case where N=1. Accordingly, the external terminal 105D is electrically connected to every two cell terminal rows of the plurality of cell terminal rows, and the external terminal 106D is also connected to every two cell terminal rows of the plurality of cell terminal rows. Is electrically connected. Each of the external terminals 105D and 106D is arranged such that a plurality of cell terminal arrays are alternately electrically connected to the external terminals 105D and 106D.

The external terminals 105D and 106D are electrically connected to a circuit outside the capacitor device in a portion electrically connected to one of the plurality of cell terminal rows (that is, each first portion of the external terminals 105D and 106D). May be connected. Instead, the external terminals 105D and 106D may be electrically connected to a circuit outside the capacitor device in their respective second portions (portions extending in the Y direction).

Similarly to the capacitor devices according to the fourth to sixth embodiments, when N is an integer equal to or larger than 2, a pair of external terminals includes a pair of cell terminal rows every N of the plurality of cell terminal rows. The position may be arranged so that it may be electrically connected to an external terminal alternately.

The capacitor device according to the eighth embodiment has an effect that the shape of the external terminal and the position at which the external terminal is electrically connected to a circuit outside the capacitor device can be customized according to customer requirements. The capacitor device may include external terminals 105D and 106D formed as in the eighth embodiment, and these external terminals 105D and 106D are short sides (sides extending in the Y direction) of the rectangular capacitor device, may be electrically connected to a circuit outside the capacitor device. Instead, the capacitor device may include external terminals 105 and 106 formed as in the third to seventh embodiments, and these external terminals 105 and 106 are the length of the rectangular capacitor device. The side (side extending in the X direction) may be electrically connected to a circuit outside the capacitor device.

The equivalent series inductance is higher in the third to seventh embodiments than in the case where the short side of the rectangular capacitor device is electrically connected to a circuit outside the capacitor device as in the eighth embodiment. Thus, the case where the long side of the rectangular capacitor device is electrically connected to a circuit outside the capacitor device is reduced.

Ninth Embodiment

Figure 31:
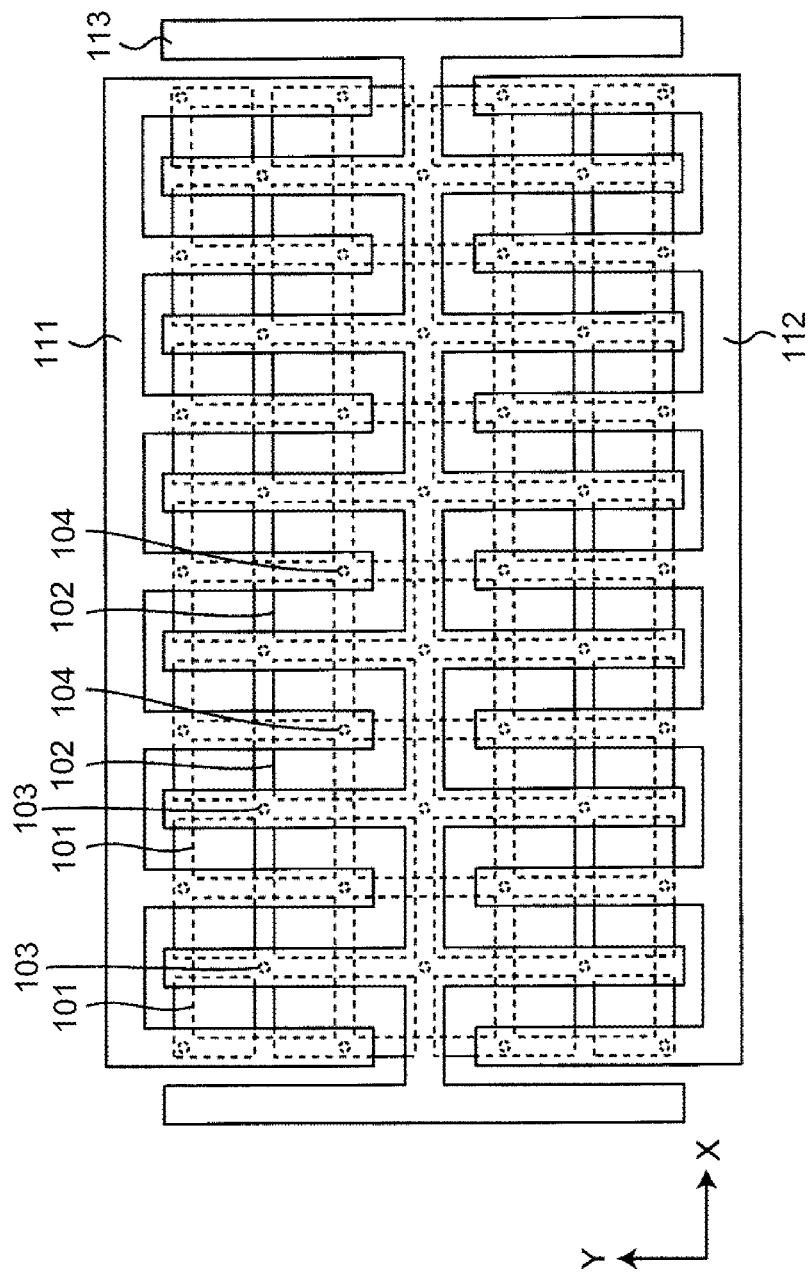
FIG. 31 is a top view showing a configuration of a capacitor device according to a ninth embodiment.

FIG. 31 is a top view showing the configuration of the capacitor device according to the ninth embodiment.

The plurality of cell terminals 103 and 104 extend in the Y direction, and form a plurality of cell terminal rows adjacent to each other in the extending direction.

The capacitor device includes external terminals 111 and 112 each having a comb shape, and an external terminal 113 having a fishbone shape. The external terminal 113 includes a plurality of first portions (portions extending in the Y direction) electrically connected to every 2N cell terminal rows of the plurality of cell terminal rows when N is an integer, and a second portion (a portion extending in the X direction) for connecting the first portions of the external terminals 113 to each other at the center of the first portions of the external terminals 113. The external terminal 111 includes a plurality of first portions (extending in the Y direction) that are electrically connected to a part of the plurality of cell terminals included in every 2N cell terminal rows of the plurality of cell terminal rows, and a second portion (a portion extending in the X direction) that connects the first portions of the external terminals 111 to each other. The external terminal 111 is formed on the first side with respect to the second portion of the external terminal 113 so as to be fitted to the first portion of the external terminal 113. The external terminal 112 includes a plurality of first portions (extending in the Y direction) that are electrically connected to a part of the plurality of cell terminals included in every 2N cell terminal rows of the plurality of cell terminal rows, and a second portion (a portion extending in the X direction) that connects the first portions of the external terminals 112 to each other. The external terminal 112 is formed to be fitted to the first portion of the external terminal 113 on the second side opposite to the first side with respect to the second portion of the external terminal 113. Each of the external terminals 111 to 113 is arranged such that every N cell terminal rows of the plurality of cell terminal rows are electrically connected to the external terminals 111 and 112 and the external terminal 113 alternately.

FIG. 31 shows a case where N=1. Accordingly, the external terminal 113 is electrically connected to every two cell terminal rows of the plurality of cell terminal rows. The external terminal 111 is electrically connected to a part of the plurality of cell terminals included in every two cell terminal rows of the plurality of cell terminal rows. Each of the external terminals 112 to 113 electrically connected to a part of the plurality of cell terminals included in every two cell terminal columns of the plurality of cell terminal columns which are arranged so as to be electrically connected to the external terminals 111 and 112 and the external terminal 113 alternately.

The external terminals 111 and 112 may be electrically connected to a circuit outside the capacitor device on the long side (side extending in the X direction) of the capacitor device. The external terminal 113 may be electrically connected to a circuit outside the capacitor device on the short side (side extending in the Y direction) of the capacitor device.

The external terminal 113 is connected to a power source, for example, and the external terminals 111 and 112 are grounded, for example.

The capacitor device according to the ninth embodiment has an effect of reducing the equivalent series inductance compared to the third to eighth embodiments by changing the shape of the external terminal.

Tenth Embodiment

Figure 32:
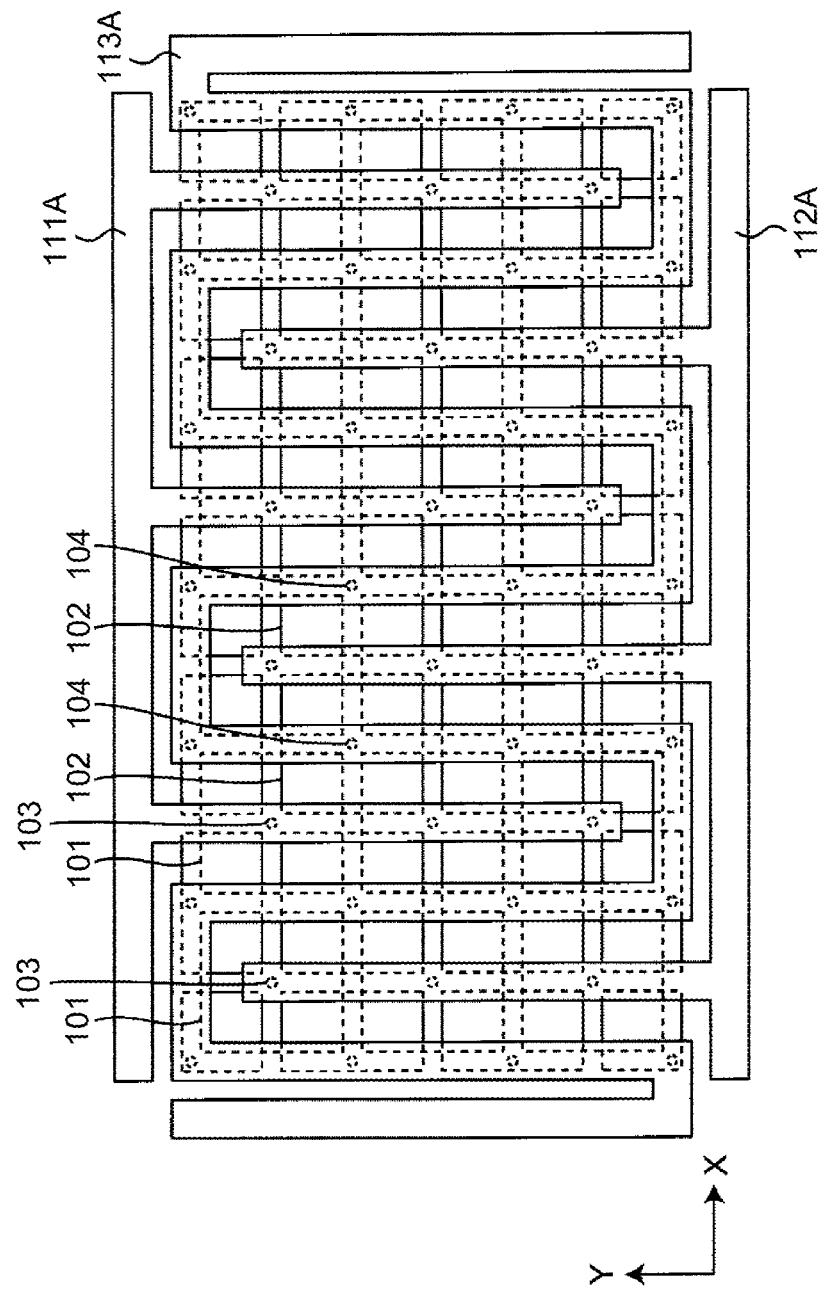
FIG. 32 is a top view showing a configuration of a capacitor device according to a tenth embodiment.

FIG. 32 is a top view showing the configuration of the capacitor device according to the tenth embodiment.

The plurality of cell terminals 103 and 104 extend in the Y direction, and form a plurality of cell terminal rows adjacent to each other in the extending direction.

The capacitor device includes external terminals 111A and 112A each having a comb shape, and an external terminal 113A having a meander shape. The external terminal 113A has a plurality of first portions (portions extending in the Y direction) electrically connected to every 2N cell terminal rows of the plurality of cell terminal rows when N is an integer. A plurality of second portions (portions extending in the X direction) that connect the first portions of the external terminals 113A to each other at either of the longitudinal ends of the first portions of the external terminals 113A. The external terminal 111A includes a plurality of first portions (portions extending in the Y direction) electrically connected to every 4N cell terminal rows of the plurality of cell terminal rows, and each of the external terminals 111A. And a second portion (a portion extending in the X direction) that connects the first portions to each other. The external terminal 111A is formed on the first side with respect to the external terminal 113A so as to be fitted to the first portion of the external terminal 113A. The external terminal 112A includes a plurality of first portions (portions extending in the Y direction) electrically connected to every 4N cell terminal rows of the plurality of cell terminal rows, and each of the external terminals 112A, and a second portion (a portion extending in the X direction) that connects the first portions to each other. The external terminal 112A is formed to be fitted to the first portion of the external terminal 113A on the second side opposite to the first side with respect to the external terminal 113A. Each of the external terminals 111A to 113A is arranged such that every N cell terminal rows of the plurality of cell terminal rows are electrically connected to the external terminals 111A or 112A and the external terminals 113A alternately.

FIG. 32 shows a case where N=1. Accordingly, the external terminal 113A is electrically connected to every two cell terminal rows of the plurality of cell terminal rows. The external terminal 111A is electrically connected to every four cell terminal rows of the plurality of cell terminal rows. The external terminal 112A is electrically connected to every four cell terminal rows of the plurality of cell terminal rows. Each of the external terminals 111A to 113A is arranged such that a plurality of cell terminal arrays are alternately electrically connected to the external terminals 111A or 112A and the external terminals 113A.

The external terminals 111A and 112A may be electrically connected to a circuit outside the capacitor device on the long side (side extending in the X direction) of the capacitor device. The external terminal 113A may be electrically connected to a circuit outside the capacitor device on the short side (side extending in the Y direction) of the capacitor device.

The external terminal 113A is connected to a power source, for example, and the external terminals 111A and 112A are grounded, for example.

According to the capacitor device of the tenth embodiment, by changing the shape of the external terminal, it is equivalent to the third to eighth embodiments as in the case of the ninth embodiment. There is an effect of reducing the series inductance.

Eleventh Embodiment

Figure 33:
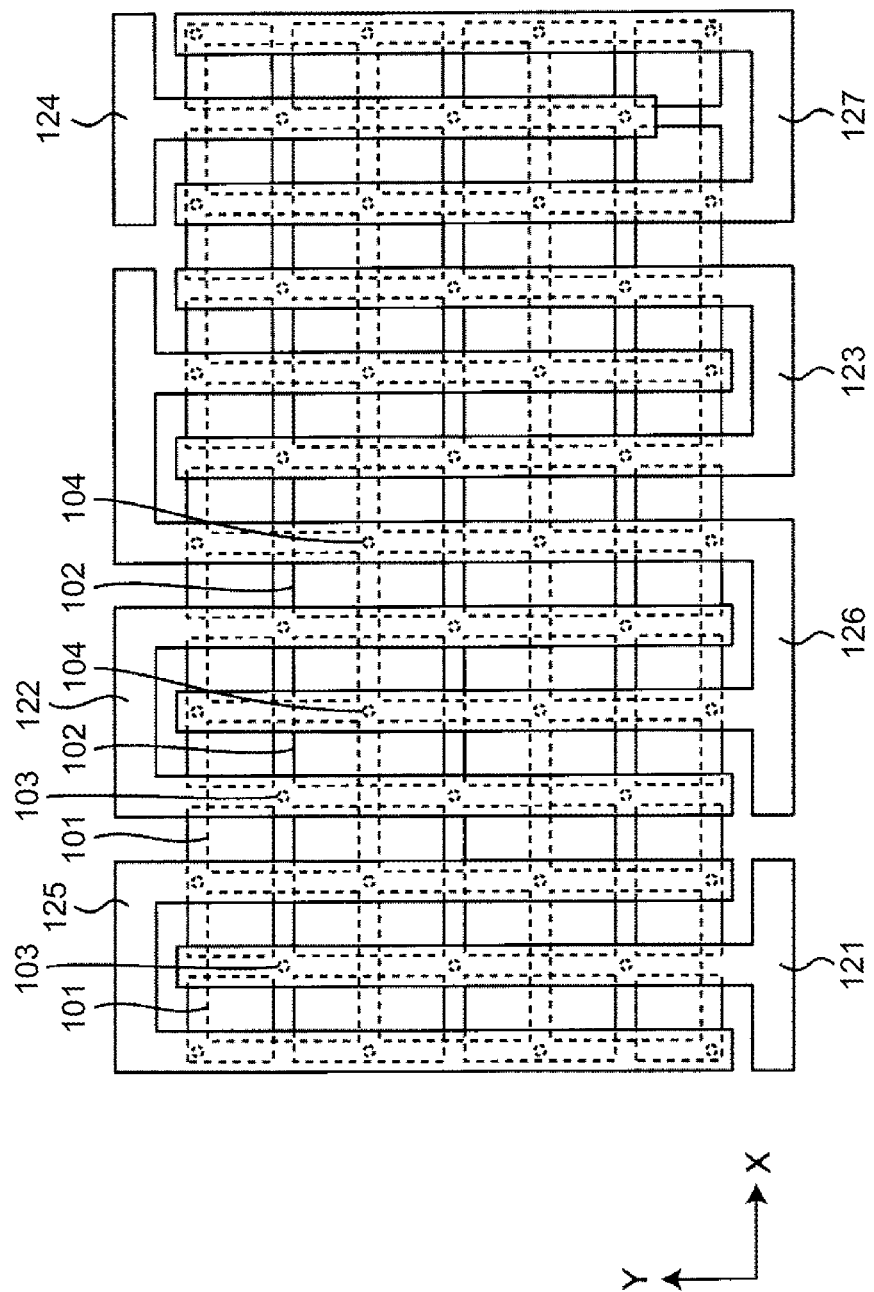
FIG. 33 is a top view showing a configuration of a capacitor device according to an eleventh embodiment.

FIG. 33 is a top view showing the configuration of the capacitor device according to the eleventh embodiment. The capacitor device may include four or more external terminals.

The plurality of cell terminals 103 and 104 extend in the Y direction, and form a plurality of cell terminal rows adjacent to each other in the extending direction.

The capacitor device includes a plurality of sets of external terminals each including first and second external terminals. In the example of FIG. 33, a set including the external terminals 121 and 125, a set including the external terminals 122 and 126, a set including the external terminals 123 and 126, and a set including the external terminals 124 and 127 are provided. Each of the first and second external terminals of each set includes a portion that is electrically connected to at least one cell terminal row of the plurality of cell terminal rows. Each of the first and second external terminals of each set is such that when N is an integer, every N cell terminal rows of the plurality of cell terminal rows are alternately connected to the first and second external terminals, arranged to be connected to each other.

FIG. 33 shows a case where N=1.

The external terminals 125 to 127 are connected to a power source, for example, and the external terminals 121 to 124 are grounded, for example. In this case, in each of the external terminals 121 to 127, a plurality of cell terminal arrays are alternately electrically connected to the external terminals 125 to 127 connected to the power source and the grounded external terminals 121 to 124. Further, among the long sides (sides extending in the X direction) of the capacitor device, the external terminals 125 and 126 connected to the power source and the external terminals 122 and 124 grounded are alternately provided on the +Y side. Similarly, of the long sides (sides extending in the X direction) of the capacitor device, the external terminals 126 and 127 connected to the power source and the external terminals 121 and 123 connected to the ground alternately on the −Y side side.

The capacitor device according to the eleventh embodiment has an effect of further reducing the equivalent series inductance compared to the ninth and tenth embodiments by changing the shape of the external terminal.

The capacitor devices according to the third to eleventh embodiments can be manufactured, for example, by the following manufacturing process.

The manufacturing method includes a plurality of lower electrodes 101 including a portion formed in a first layer of a semiconductor substrate, arranged at a period d1 in the X direction and arranged at a period d2 in the Y direction. A plurality of upper electrodes including a step of forming an electrode 101 and a portion formed in a second layer different from the first layer of the semiconductor substrate, the electrodes being arranged at a period d1 in the X direction, and in the Y direction; forming a plurality of upper electrodes 102 arranged at a period d2. The step of forming each upper electrode 102 is arranged so as to be shifted by half the length of the period d1 in the X direction with respect to each lower electrode 101 and shifted by half the length of the period d2 in the Y direction.

Each lower electrode 101 and each upper electrode 102 are partly opposed and capacitively coupled to each other, and each pair of lower electrode 101 and upper electrode 102 that are capacitively coupled to each other form a capacitor cell C.

The manufacturing method includes a plurality of cell terminals 103 including a portion formed in a third layer different from the first and second layers of the semiconductor substrate, arranged at a period d1 in the X direction, and a period in the Y direction. A step of forming a plurality of cell terminals 103 arranged at d2 and electrically connected to the plurality of lower electrodes 101, and a plurality of cell terminals 104 including a portion formed in the third layer of the semiconductor substrate and forming a plurality of cell terminals 104 arranged in the X direction at a period d1 and arranged in the Y direction at a period d2 and electrically connected to the plurality of upper electrodes 102, respectively, is performed. The second layer is located between the first and third layers. The step of forming each cell terminal 104 is arranged with respect to each cell terminal 103 by being shifted by half the length of the period d1 in the X direction and by being shifted by half the length of the period d2 in the Y direction.

The manufacturing method further includes forming at least two external terminals that are respectively electrically connected to a part of the plurality of cell terminals including the plurality of cell terminals 103 and the plurality of cell terminals 104.

Figure 34:
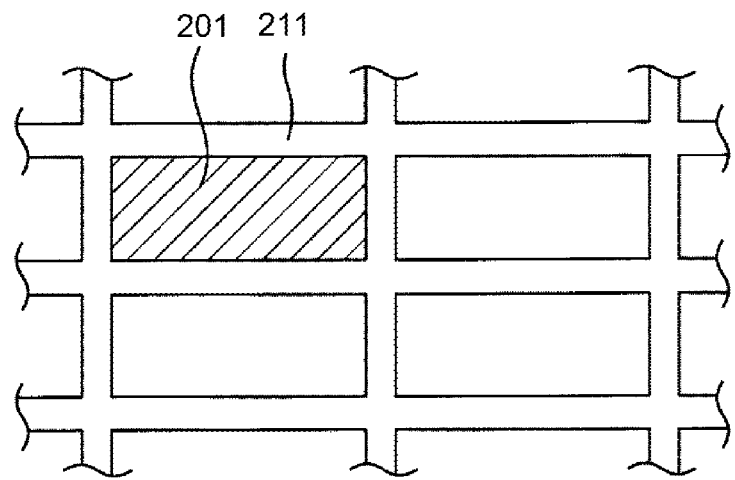
FIG. 34 is a schematic diagram for explaining a method for manufacturing a capacitor device according to third to eleventh embodiments.
Figure 35:
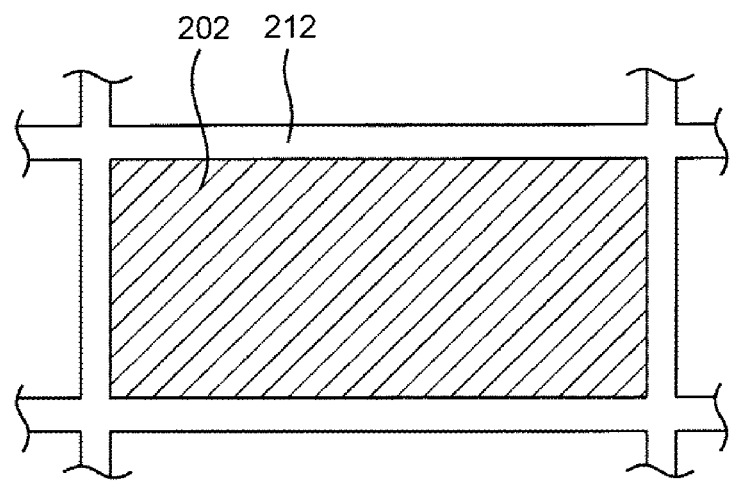
FIG. 35 is a schematic diagram for explaining a method for manufacturing a capacitor device according to third to eleventh embodiments.

FIGS. 34 and 35 are schematic views for explaining the capacitor device manufacturing method according to the third to eleventh embodiments.

At present, a capacitor device of a type called MLCC (multilayer ceramic capacitor) is generally used as a decoupling capacitor. Many of such capacitor devices have a rectangular parallelepiped outer shape and are external terminals having the shapes described in the third to eleventh embodiments, and have been described in the third to eleventh embodiments. Thus, an external terminal connected to an external circuit is provided. Various configurations can be taken by providing compatibility with MLCC when mounting the capacitor device and changing only one mask to meet customer requirements.

MLCC capacitor devices are available in various sizes. When manufacturing a capacitor device, a scribe line and a guard ring are arranged so that a chip having the smallest size can be cut out from a silicon wafer. In the capacitor device according to the third to eleventh embodiments of the present invention, the size of the capacitor device can be changed by changing only three masks as described below. Thereafter, by removing the scribe line and the guard ring, it is possible to connect the chips of each capacitor device with metal wiring. For this reason, the size of the capacitor device can be changed to be scalable.

Referring to FIG. 34, metal wiring 211 used as a scribe line and a guard ring is formed on a semiconductor substrate in the manufacturing process of the capacitor device. The capacitor device region 201 has, for example, a 05025 size (500×250 μm). When manufacturing a capacitor device having a size larger than that of the region 201, as shown in FIG. 35, a metal wiring 212 is formed on the semiconductor substrate. Thereby, for example, the region 202 of the capacitor device having a 1005 size (1000×500 μm) can be obtained.

The manufacturing method performs the following steps according to a desired position where the external terminal is electrically connected to a circuit outside the capacitor device, a desired capacitance and desired breakdown voltage of the capacitor device, and a size of the capacitor device. That is, the manufacturing method includes a step of selecting a first mask for forming a metal wiring used as a scribe line and a guard ring, a step of selecting a second mask for forming an external terminal, selecting a third mask for forming a cell terminal for connecting the metal wiring and the external terminal to each other among the cell terminals.

According to the capacitor devices according to the third to eleventh embodiments, only a small number of masks need be changed, so that the design change of the capacitor device can be performed at low cost.

When it is planned to use the capacitor device of FIG. 18 for a plurality of applications, the number of rows and/or columns of the capacitor cell C of the capacitor device is equal to the number of capacitor cells connected in series required for each application, set to least common multiple or multiple.

Figure 36:
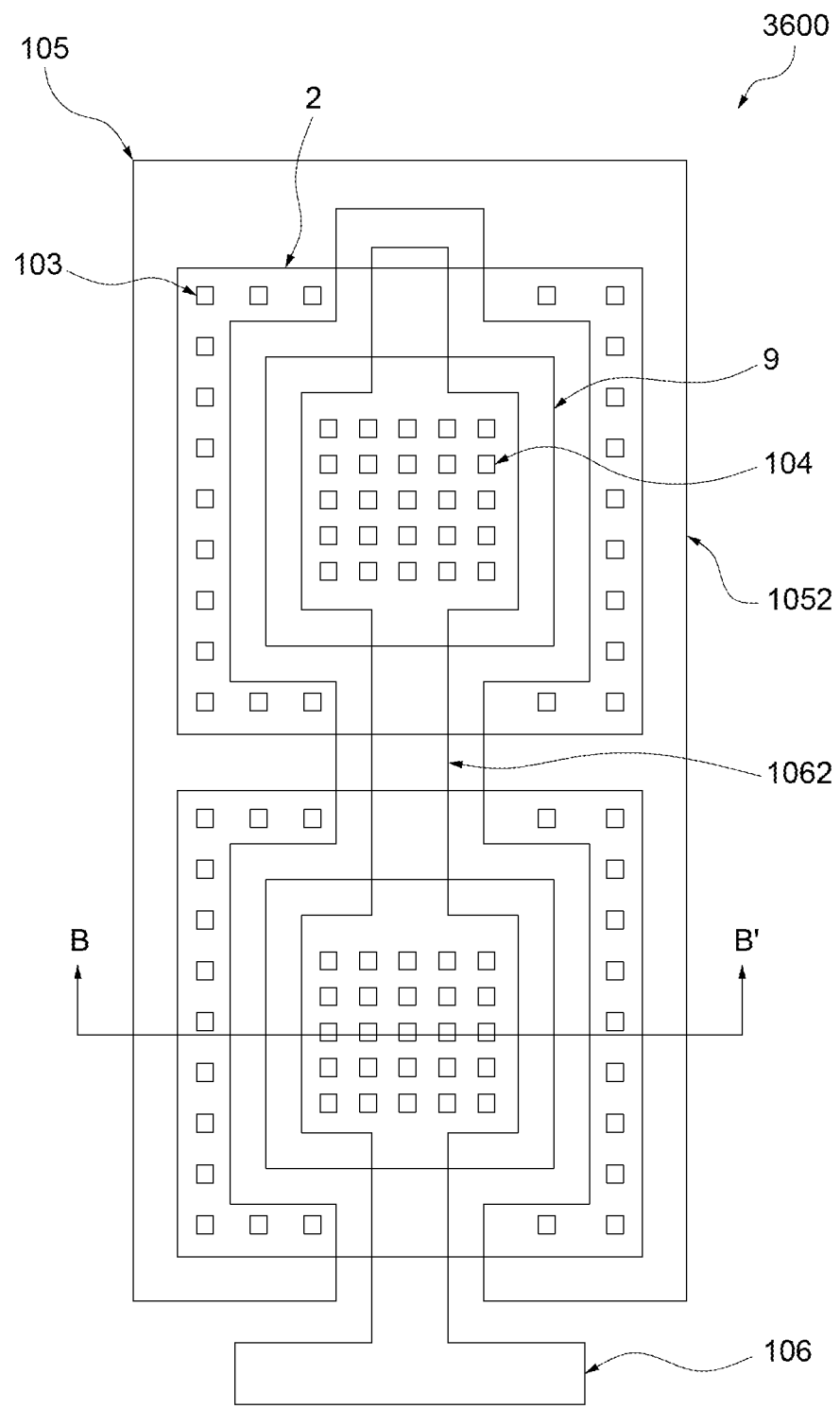
FIG. 36 is a diagram illustrating a top view of a capacitor device according to the embodiment of the present invention.
Figure 37:
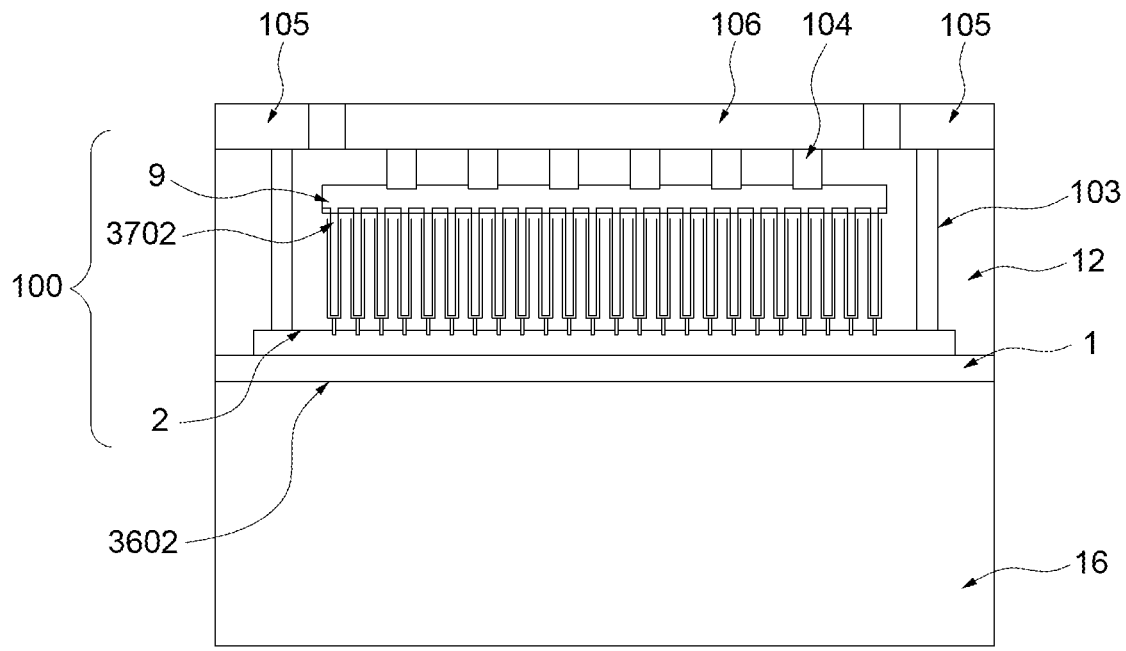
FIG. 37 shows a cross-sectional view of a capacitor device according to an embodiment of the present invention.

According to the present invention, when the capacitor device with a specific size (e.g. 05025 size or 1005 size) is manufactured, i.e. when the capacitor device is diced to form a discrete capacitor device, the appearance characteristic of the capacitor device may be different from the appearance characteristic of the existing MLCC capacitor device. FIG. 36 is a diagram illustrating a top view of a capacitor device 3600 according to the embodiment of the present invention. FIG. 37 shows a cross-sectional view of the capacitor device 3600 according to the embodiment of the present invention, in which the cross-sectional view is taken along line B-B' in FIG. 36. For brevity, the numerals of elements in the capacitor device 3600 are similar to those in FIGS. 13, 18, 19, and 20. The capacitor device 3600 is a diced capacitor device that is fabricated by the general-purpose DRAM semiconductor process technology. In this embodiment, the capacitor device 3600 comprises two capacitor unit cells (e.g. the unit cell 100), however this is not a limitation of the present invention. The capacitor device 3600 may comprise multiple capacitor unit cells, in which the capacitor unit cells may be connected in series and/or in parallel as described in the above paragraphs. It is noted that the size of the capacitor device 3600 may also affect the ESR or parasitic inductance effect of the capacitor device 3600. According to an embodiment, the width as well as the length of the capacitor device 3600 falls within the range of 10 μm to 50 μm may have a relatively good balance for ESL effect and density.

According to the embodiment, the capacitor device 3600 comprises the substrate 16, the oxide layer 1, the interlayer oxide film 12, and the external terminals 105 and 106, wherein the substrate 16 may be a semiconductor substrate or a glass substrate, the oxide layer 1 is an insulation layer, the interlayer oxide film 12 may be an insulation film, and the external terminals 105 and 106 may be the two conductive pads of the capacitor device 3600. The external terminals 105 and 106 may be formed on the exposed metal layer or the top conductive or metal layer of the interconnect layer on the substrate 16. The external terminal 105 may be disposed on a first side on the top surface of the capacitor device 300 while the external terminal 105 may be disposed on a second side on the top surface of the capacitor device 300, and the second side may be opposite to the first side as shown in FIG. 36. However, this is not a limitation of the present invention. According the embodiment, when the substrate 16 is a glass substrate, the ESL or parasitic inductance effect may be improved. Moreover, the capacitor unit cells 100 are formed inside and covered by the interlayer oxide film 12 on the substrate 16, and thus the capacitor unit cells 100 are not exposed elements of the capacitor device 3600. Each of the capacitor unit cells 100 is a stack capacitor. As shown in FIG. 37, the external terminal 105 is electrically connected to the lower electrode (i.e. the metal film 2) of the capacitor unit cells 100 through the cell terminals 103, and the external terminal 106 is electrically connected to the upper electrode (i.e, the metal film 9) of the capacitor unit cells 100 through the cell terminals 104. According to the embodiment, as shown in Ha 36, the external terminal 105 further comprises a plurality of conductive portions 1052, and each of the first conductive portions 1052 having a first terminal coupled to the conductive pad of external terminal 105, and a second terminal extending toward the conductive pad of external terminal 106 and the second terminal is not electrically connected to the external terminal 106. The external terminal 106 further comprises a plurality of conductive portions 1062, and each of the first conductive portions 1062 having a first terminal coupled to the conductive pad of external terminal 106, and a second terminal extending toward the conductive pad of external terminal 105 and the second terminal is not electrically connected to the external terminal 105.

According to the present invention, the conductive portions 1052 and 1062 may, be the above mentioned comb shape structures of the capacitor device. In the embodiment as shown in Fla 36, the conductive portion 1052 as well as the conductive portion 1062 may not be a regular rectangle layer, More specifically, the shape of the conductive portion 1052 as well as the conductive portion 1062 is formed by alternating rectangle or square metal layers. Moreover, each of the cell terminals 103 of the capacitor cell 100 has a first terminal electrically, connected to the conductive portions 1052, and a second terminal electrically connected to the metal film 2 (i.e. the lower electrode) of the capacitor cell 100. Each of the cell terminals 104 of the capacitor unit cell 100 has a first terminal electrically connected to the conductive portions 1062, and a second terminal electrically connected to the metal film 9 (i.e. the upper electrode) of the capacitor unit cell 100. The cell terminals 103 and 104 may be a plurality of via conductors. It is noted that, for description purpose, the cell terminals 103, the cell terminals 104, the metal film 9, and the metal film 2, which are disposed below the external terminal 105 and the external terminal 106 are also shown in FIG. 36.

According to the embodiment, the substrate 16 has a substrate surface 3602. The oxide layer 1 is formed on the substrate surface 3602. The metal film 2 (i.e. the lower electrode) of the capacitor unit cell(s) 100 is formed on the upper surface of the oxide layer 1. It is noted that the oxide layer 1 may be an optional insulation layer. When the oxide layer 1 is omitted in another embodiment, the metal film 2 of the capacitor unit cell(s) 100 may be formed on the substrate surface 3602 of the substrate 16.

Figure 38:
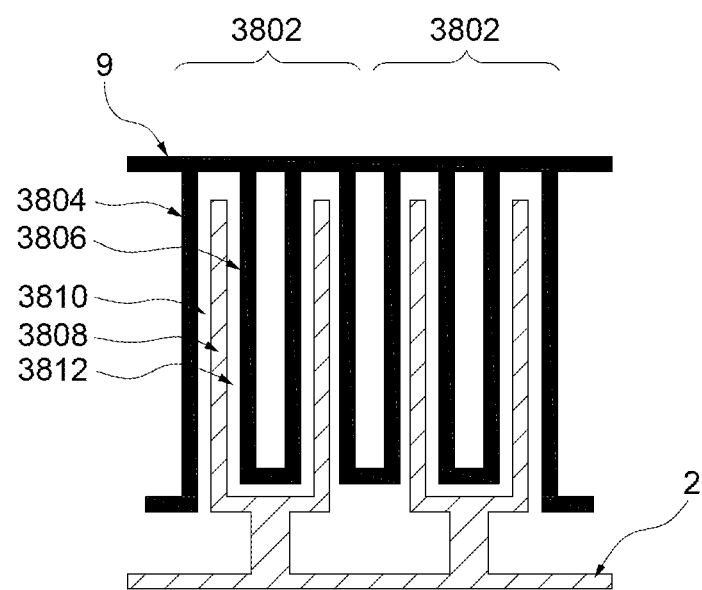
FIG. 38 is a diagram illustrating a plurality of capacitor cells in crown type according to an embodiment of the present invention.

According to the present embodiment, for a capacitor unit cell 100, a plurality of capacitor cells 3702 are formed between the metal film 2 and the metal film 9. The configuration of the capacitor cells 3702 may be the crown type capacitive structure or concave type capacitive structure. FIG. 38 is a diagram illustrating a plurality of capacitor cells 3802 in crown type according to an embodiment of the present invention. For description purpose, some element numerals in FIG. 38 are similar to the element numerals in FIG. 13. For each capacitor cell 3802 in crown type, the capacitive unit 3802 comprises a first conductor film 3804, a second conductor film 3806, a third conductor film 3808, a first insulating film 3810, and a second insulating film 3812. The first conductor film 3804, the second conductor film 3806, the third conductor film 3808, the first insulating film 3810, and the second insulating film 3812 are disposed between the metal film 2 and the metal film 9. The insulating films 3810 and 3812 are composed of high-k (high dielectric) material. For example, the high-k material may contain at least one of the oxides of Lanthanum, Hafnium, and Zirconium.

More specifically, the first conductor film 3804 and the second conductor film 3806 have first portions electrically connected to the metal film 9, and the first conductor film 3804 and the second conductor film 3806 have second portions vertically extending toward the metal film 2 from the metal film 9. The second portions of the first conductor film 3804 and the second conductor film 3806 are disconnected from the metal film 2. The first portions may be the base portions of the first conductor film 3804 and the second conductor film 3806 respectively. The second portions may be the top portions of the first conductor film 3804 and the second conductor film 3806 respectively. Moreover, the third conductor film 3808 has a first portion electrically connected to the metal film 2, and a second portion vertically extending toward the metal film 9 from the metal film 2. The first portion may be the base portion of the third conductor film 3808, and the second portion may be the top portion of the third conductor film 3808. The first insulating film 3810 is disposed between the first conductor film 3804 and the third conductor film 3808. The second insulating film 3812 is disposed between the second conductor film 3806 and the third conductor film 3808. According to the embodiment, the capacitor cell 3802 may be similar to the capacitor cell 30, the first conductor film 3804 and the second conductor film 3806 may be similar to the conductor film 6, the third conductor film 3808 may be similar to the conductor film 4, and the first insulating film 3810 and the second insulating film 3812 may be similar to the insulating films 5 as shown in the above FIG. 13, thus the detailed description is omitted here for brevity.

Figure 39:
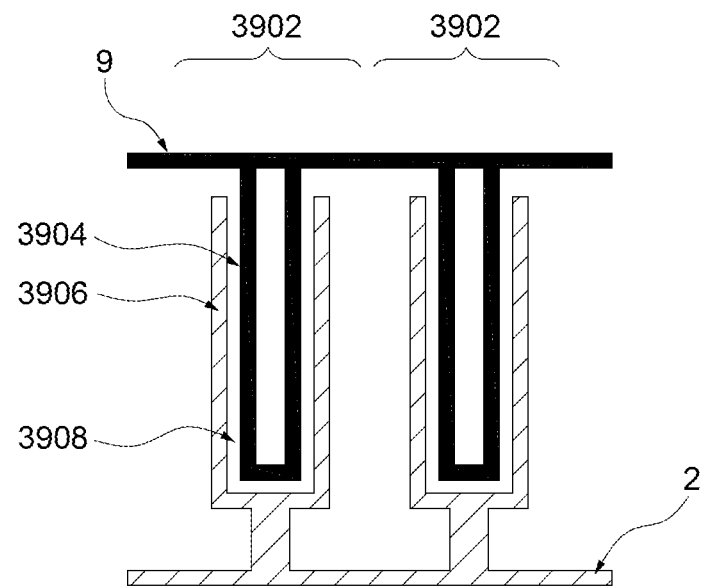
FIG. 39 is a diagram illustrating a plurality of capacitor cells in concave type according to an embodiment of the present invention.

FIG. 39 is a diagram illustrating a plurality of capacitor cells 3902 in concave type according to an embodiment of the present invention. For description purpose, some element numerals in FIG. 39 are similar to the element numerals in FIG. 13. For each capacitor cell 3902 in concave type, the capacitor cell 3902 comprises a first conductor film 3904, a second conductor film 3906, and an insulating film 3908. The first conductor film 3904, the second conductor film 3906, and the insulating film 3908 are disposed between the metal film 2 and the metal film 9. More specifically, the first conductor film 3904 has a first portion electrically connected to the metal film 9, and a second portion vertically extending toward the metal film 2 from the metal film 9. The second portion of the first conductor film 3904 is disconnected from the metal film 2. The first portion may be the base portion of the first conductor film 3904. The second portion may be the top portion of the first conductor film 3904. The insulating film 3908 is disposed between the first conductor film 3904 and the second conductor film 3906.

According to the embodiment, the capacitor cell 3902 may be similar to the capacitor cell 30, the first conductor film 3904 stay be similar to the conductor film 6, the second conductor film 3906 may be similar to the conductor film 4, and the insulating film 3908 may be similar to the insulating films 5 as shown in the above FIG. 13, thus the detailed description is omitted here for brevity.

FIG. 40 is a top view diagram illustrating a plurality of capacitor cells 4000 according to an embodiment of the present invention. The capacitor cells 4000 may be a plurality of capacitor cells 3802 or a plurality of capacitor cells 3902. For brevity, the capacitor cells 4000 in FIG. 40 are a plurality of capacitor cells 3902. The left side (i.e. 4002) of FIG. 40 illustrates a plurality of capacitor cells 4000 arranged to be a rectangular array in between the metal film 2 and metal film 9 when viewing to the top of the capacitor unit cell 100. The right side (i.e. 4004) of FIG. 40 illustrates a plurality of capacitor cells 4000 arranged to be a hexagonal array in between the metal film 2 and metal film 9 when viewing to the top of the capacitor unit cell 100. However, this is not a limitation of the present invention. The array of capacitor cells 4000 may be arranged to be any symmetrical shape depended on the requirement.

According to the present invention, the capacitor unit cells 100 are formed between the substrate surface 3602 and the bottom metal layer (i.e. the lowest metal layer) of the interconnect structure disposed above the substrate 16. The interconnect structure may comprise a plurality of metal layers and a plurality of interlayer dielectric layers, wherein the metal layers and the interlayer dielectric layers are stacked alternately above the substrate 16. For the interconnect structure, the metal layer closest to the substrate 16 is the bottom or lowermost metal layer, and the metal layer farthest to the substrate 16 is the top or uppermost metal layer. The top metal layer is the exposed metal layer. According to the embodiment, the external terminals 105 and 106 are formed in the top metal layer of the interconnect structure. When the interconnect structure has only one metal layer (i.e. the embodiment as shown in FIG. 37), the bottom metal layer and the top metal layer are the same layer.

Figure 41:
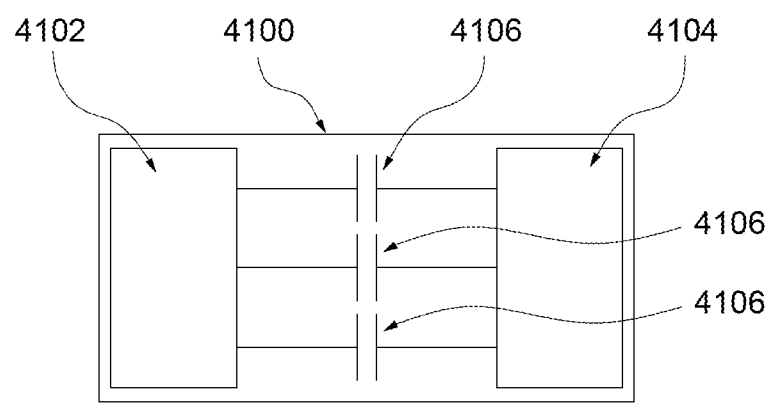
FIG. 41 is a top view illustrating capacitor device according to an embodiment of the present invention.

FIG. 41 is a top view diagram illustrating a capacitor device 4100 according to an embodiment of the present invention. The capacitor device 4100 is a diced capacitor device (e.g. 3600). The top view of the capacitor device 4100 comprises a first conductive pad 4102 and a second conductive pad 4104, wherein the first conductive pad 4102 may be the above mentioned external terminal 105 and the second conductive pad 4104 may be the above mentioned external terminal 106. For brevity, a plurality of capacitor unit cells 4106 are also shown in FIG. 41, in which the capacitor unit cells 4106 may be the above mentioned capacitor unit cells 100. The capacitance of the capacitor device 4100 may be adjusted by the number of capacitor unit cells 4106 connected between the first conductive pad 4102 and the second conductive pad 4104. According to the embodiment, the first conductive pad 4102 and the second conductive pad 4104 are arranged to be attached by a first external bonding device and a second external bonding device respectively. The first external bonding device and the second external bonding device may be a first and a second bonding wires respectively. However, this is not a limitation of the present invention.

Figure 42:
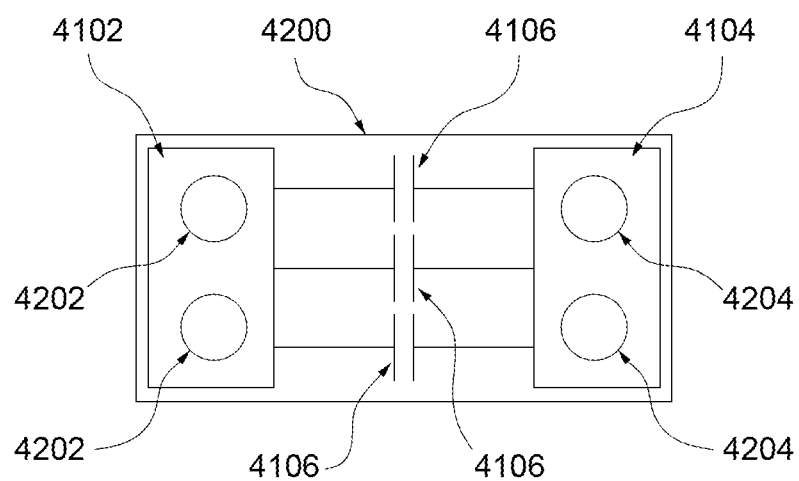
FIG. 42 is a top view diagram illustrating a capacitor device according to an embodiment of the present invention.

FIG. 42 is a top view diagram illustrating a capacitor device 4200 according to an embodiment of the present invention. For brevity, the element numerals of the capacitor device 4200 are similar to those of the capacitor device 4100. In this embodiment, the first conductive pad 4102 is attached by two conductive bumps 4202, and the second conductive pad 4104 is attached by two conductive bumps 4204. However, this is not a limitation of the present invention. Each of the first conductive pad 4102 and the second conductive pad 4104 may be attached by appropriate number (e.g. 1, 2, or 3) of conductive bumps. Moreover, the conductive bumps may be C4 (Controlled-collapse-chip-connection) solder bumps, gold bumps, or micro-bumps used in the flip-chip technology.

Figure 43:
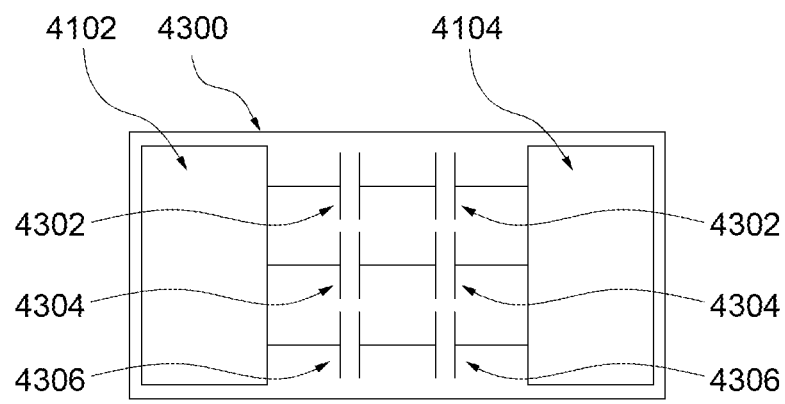
FIG. 43 is a top view diagram illustrating a capacitor device according to an embodiment of the present invention.

In addition, the capacitor device 4100 has a voltage tolerance V when the three capacitor unit cells 4106 are connected in parallel between the first conductive pad 4102 and the second conductive pad 4104. To obtain a capacitor device with different voltage tolerance, the connection of capacitor unit cells between the first conductive pad 4102 and the second conductive pad 4104 may be re-configured. FIG. 43 is a top view diagram illustrating a capacitor device 4300 according to an embodiment of the present invention. For brevity, the element numerals of the capacitor device 4300 are similar to those of the capacitor device 4100. In comparison to the capacitor device 4100, the capacitor device 4300 comprises three capacitor unit cells 4302, 4304, and 4306 connected in parallel, and each of the capacitor unit cells 4302, 4304, and 4306 further comprises two capacitor unit cells connected in series. Under this configuration, the voltage tolerance of the capacitor device 4300 may be 2*V. However, this is not a limitation of the present invention.

Figure 44:
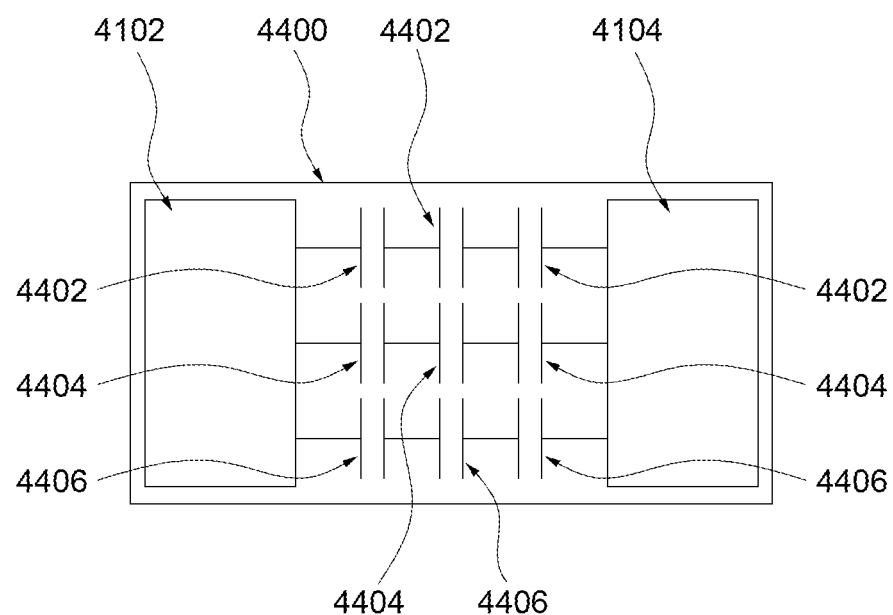
FIG. 44 is a top view diagram illustrating a capacitor device according to an embodiment of the present invention.

FIG. 44 is a top view diagram illustrating a capacitor device 4400 according to an embodiment of the present invention. For brevity, the element numerals of the capacitor device 4400 are similar to those of the capacitor device 4100. In comparison to the capacitor device 4100, the capacitor device 4400 comprises three capacitor unit cells 4402, 4404, and 4406 connected in parallel, and each of the capacitor unit cells 4402, 4404, and 4406 further comprises three capacitor unit cells connected in series. Under this configuration, the voltage tolerance of the capacitor device 4400 may be 3*V. Therefore, by adjusting the number and connectivity of the capacitor unit cells between the first conductive pad 4102 and the second conductive pad 4104, the voltage tolerance of a capacitor device may be adjusted. The re-configuration of the capacitor unit cells between the first conductive pad 4102 and the second conductive pad 4104 has been description in the above paragraphs related to FIG. 23 to FIG. 35, thus the detailed description is omitted here for brevity.

Figure 45:
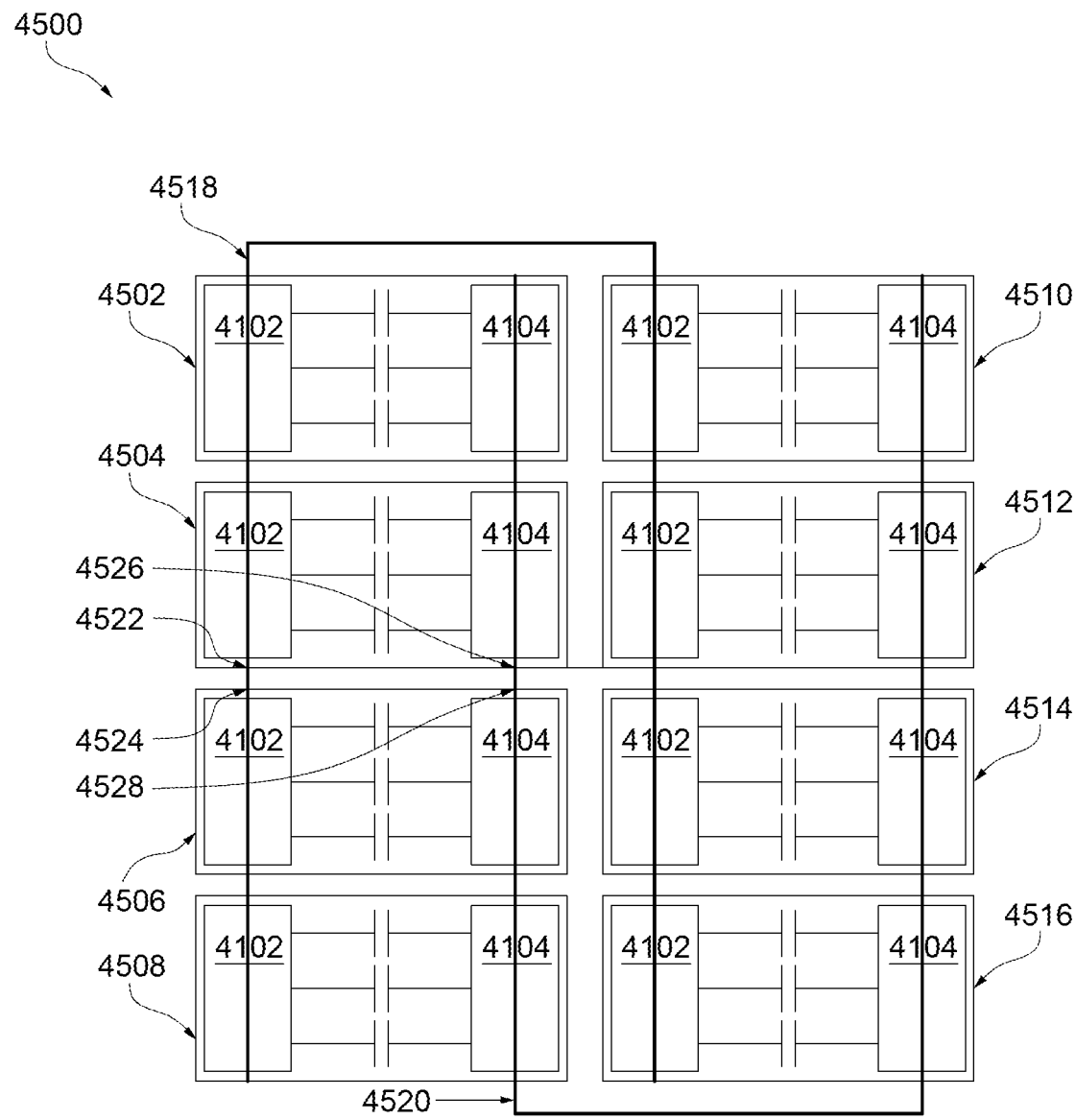
FIG. 45 is a diagram illustrating a wafer-level capacitor devices according to an embodiment of the present invention.

FIG. 45 is a diagram illustrating a wafer-level capacitor devices 4500 according to an embodiment of the present invention. The capacitor devices 4500 are still on the wafer prior to singulation. According to the present invention, prior to singulation, the function of the capacitor devices 4500 should be tested and verified. Instead of one-by-one testing the capacitor devices 4500 on the wafer, the present invention provides a novel mechanism to test a plurality of capacitor devices on the wafer at a time as shown in FIG. 45. More specifically, when the capacitor devices 4500 are manufactured on the wafer, the capacitor devices 4500 are grouped into a plurality of capacitor groups, and each capacitor group comprises a specific number of capacitor devices. The specific number may be any appropriate integer number, e.g. 20 or 100, depending on the practical requirement. The first electrodes of the capacitor devices in a capacitor group are electrically connected with each other, and the second electrodes of the capacitor devices in the capacitor group are electrically connected with each other.

For the example as shown in FIG. 45, the plurality of capacitor devices 4502-4516 may form a group of capacitor devices. For brevity, each of the capacitor devices 4502-4516 is similar to the above mentioned capacitor device 4100. In addition, a first conductive line 4518 is further arranged to electrically connect the first conductive pads 4102 of the capacitor devices 4502-4516, and a second conductive line 4520 is further arranged to electrically connect the second conductive pads 4104 of the capacitor devices 4502-4516. According to the embodiment, the first conductive line 4518 may be formed on any metal layer in the interconnect layer on the substrate 16 as long as the first conductive pads 4102 of the capacitor devices 4502-4516 are electrically connected. Similarly, the second conductive line 4520 may be formed on any metal layer in the interconnect layer on the substrate 16 as long as the second conductive pads 4104 of the capacitor devices 4502-4516 are electrically connected.

According to the embodiment, the first conductive line 4518 and the second conductive line 4520 may pass through the boundaries of two adjacent capacitor devices in order to electrically connect the two adjacent capacitor devices. For the example of the capacitor devices 4504 and 4506, the first conductive line 4518 may pass through the boundary 4522 of the first conductive pads 4102 of the capacitor device 4504 and the boundary 4524 of the first conductive pads 4102 of the capacitor device 4506. The second conductive line 4520 may pass through the boundary 4526 of the second conductive pads 4104 of the capacitor device 4504 and the boundary 4528 of the second conductive pads 4104 of the capacitor device 4506.

Accordingly, during the testing process, when the testing signals are applied to the first conductive line 4518 and the second conductive line 4520, the group of capacitor devices 4502-4516 may be tested at a same time. For example, the testing probes of a testing device (not shown in FIG. 45) may be attached on the first conductive pad 4102 and the second conductive 4104 for testing the group of capacitor devices 4502-4516. If the testing result indicates a leakage current occurred to the group, which means that at least one capacitor device in the group is functional fail, then all of the capacitor devices 4502-4516 in the group may be regarded as bad devices. Therefore, in comparison to the method of one-by-one testing the capacitor devices on the wafer, the present wafer-level testing process of the capacitor devices 4500 may be expedited.

In addition, when the capacitor devices 4502-4516 are diced, the portions of conductive line 4518 and the portions of conductive line 4520 may remain in the interconnect structures of the diced capacitor devices 4502-4516 when the conductive lines 4518 and 4520 are cut. Accordingly, the two ends of the portion of conductive line 4518 in a diced capacitor device may expose the lateral surface of the two cutting sides of the diced capacitor device, and the two ends of the portion of conductive line 4520 in the diced capacitor device may expose the lateral surface of the two cutting sides of the diced capacitor device. For the example of a diced capacitor device (e.g. 4504), the first end of the portion of conductive line 4518 may expose the lateral surface (e.g. 4522) on the first side of the diced capacitor device 4504, and the first end of the portion of conductive line 4520 may expose the lateral surface (e.g. 4526) on the first side of the diced capacitor device 4504.

Figure 46:
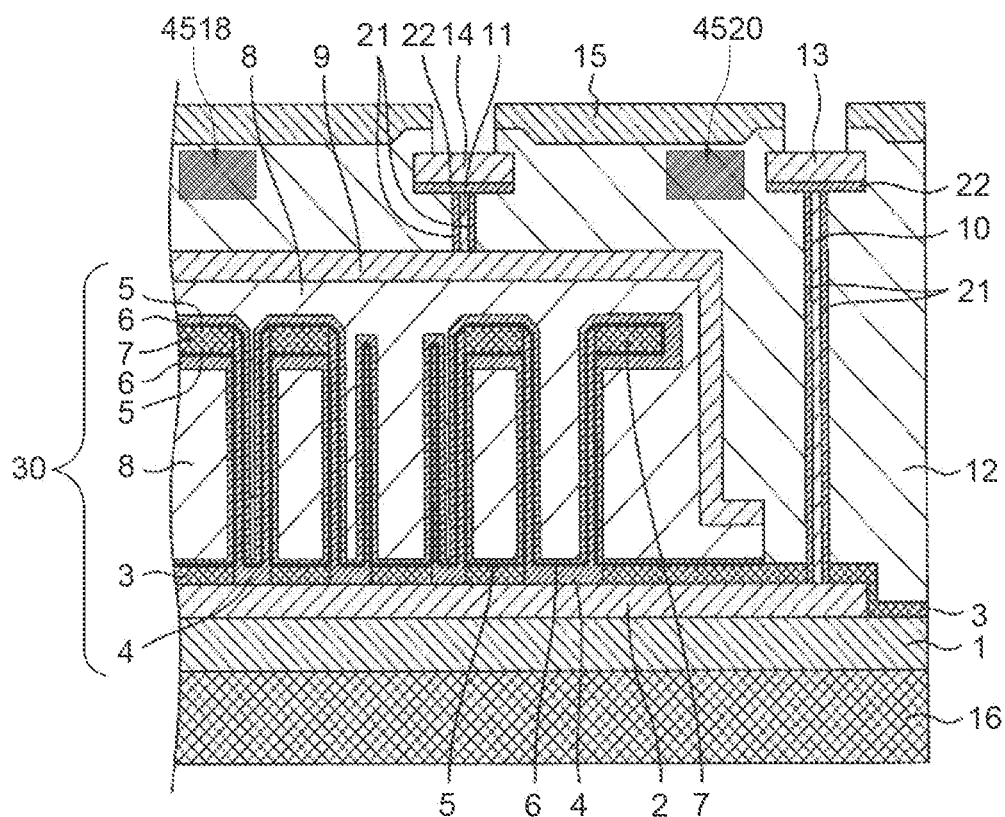
FIG. 46 is a diagram illustrating a cross-sectional view a diced capacitor device according to an embodiment of the present invention.

FIG. 46 is a diagram illustrating a cross-sectional view a diced capacitor device according to an embodiment of the present invention. FIG. 46 is a modification of the capacitor device as shown in the above mentioned FIG. 13. For brevity, the numerals of elements of the capacitor device FIG. 46 are similar to those in FIG. 13. In comparison to FIG. 13, the conductive line 4518 and the conductive line 4520 are further shown in FIG. 46. In this embodiment, the conductive lines 4518 and 4520 are formed on the same metal layer as the pad conductors 13 and 14. However, this is not the limitation of the present invention. The conductive lines 4518 and 4520 may be formed on any metal layer in the interconnect layer on the substrate 16 as long as the conductive lines 4518 and 4520 are electrically connected to the pad conductors 13 and 14 respectively.

INDUSTRIAL APPLICABILITY

The capacitor device according to each embodiment of the present invention is useful, for example, as an on-package decoupling capacitor. In semiconductor devices, there are problems such as a decrease in voltage tolerance range due to a decrease in power supply voltage, generation of large power supply noise or ground noise due to an increase in current consumption, and a decrease in EMI resistance due to an increase in operating frequency. In order to reduce this problem, it is effective to use a decoupling capacitor. By using the capacitor device according to each embodiment of the present invention, it is possible to provide a semiconductor device in which the above problems are reduced.

While various embodiments in accordance with the disclosed principles are described above, it should be understood that they are presented by way of example only, and are not limiting. Thus, the breadth and scope of example embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A capacitor device, comprising:
   a substrate;
   an insulation film, disposed on the substrate;
   a plurality of capacitor unit cells, being covered by the insulation film on the substrate, each of the capacitor unit cells comprising a plurality of first electrodes and a plurality of second electrodes disposed over the first electrodes;
   an exposed conductive layer, disposed on each of the capacitor unit cells and the insulation film, the exposed conductive layer having a first conductive pad formed on a first side of the exposed conductive layer and a second conductive pad formed on a second side different from the first side;

wherein the first conductive pad and the second conductive pad are electrically connected to the first electrodes and the second electrodes of each of the capacitor unit cells respectively, the first electrodes are arranged in a first period in a first direction and in a second period in a second direction, the second electrodes are arranged in the first period in the first direction and in the second period in the second direction and shifted by substantially half a first length of the first period in the first direction and substantially half a second length of the second period in the second direction with respect to the first electrodes, and one of the plurality of first electrodes and an adjacent one of the plurality of second electrodes form a pair and are partially opposed to each other and are coupled capacitively to each other.

2. The capacitive device of claim 1, wherein the substrate is a semiconductor substrate or a glass substrate.

3. The capacitive device of claim 1, wherein the first side is opposite to the second side on the exposed conductive layer.

4. The capacitive device of claim 1, wherein the substrate has a substrate surface, each of the capacitor unit cells further comprises at least one dielectric structure, the first electrodes are disposed over the substrate surface, the at least one dielectric structure is disposed over the first electrodes, and the second electrodes are disposed over the at least one dielectric structure.

5. The capacitive device of claim 1, further comprising: an insulation layer, disposed on the substrate surface; wherein the first electrodes of each of the capacitor unit cells are disposed on the insulation layer.

6. The capacitive device of claim 1, wherein the exposed conductive layer further comprises:

a plurality of first conductive portions, each of the first conductive portions having a first terminal coupled to the first conductive pad, and a second terminal extending toward the second side; and a plurality of second conductive portions, each of the second conductive portions having another first terminal coupled to the second conductive pad, and another second terminal extending toward the first side.

7. The capacitive device of claim 6, further comprising: a plurality of first via conductors, each having another first terminal electrically connected to the first conductive portions and another second terminal electrically connected to the at least one first electrodes; and a plurality of second via conductors, each having another first terminal electrically connected to the second conductive portions and another second terminal electrically connected to the at least one second electrodes.

8. The capacitive device of claim 1, wherein each of the capacitor unit cells further comprises:

at least one first conductor film, having a first portion electrically connected to the first electrodes, and having a second portion vertically extending toward the second electrodes from the first electrodes;

at least one second conductor film, having a first portion electrically connected to the second electrodes, and having a second portion vertically extending towards the first electrodes from the second electrodes; and at least one insulating film, disposed between the at least one first conductor film and the at least one second conductor film.

9. The capacitive device of claim 8, wherein the at least one first conductor film together with the at least one second conductor film and the at least one insulating film are arranged to be a rectangular array or a hexagonal array, as a top of the capacitor unit cells.

10. The capacitive device of claim 1, wherein each of the capacitor unit cells is a crown-type stack capacitor or a concave-type stack capacitor.

11. The capacitor device of claim 1, further comprising:

a first conductive line disposed in the insulation film, the first conductive line extends along one of the first direction or the second direction and comprises a first end and a second end opposing the first end; and a second conductive line disposed in the insulation film, the second conductive line extends along the one of the first direction or the second direction and comprises a third end and a fourth end opposing the third end;

wherein the insulation film comprises a first lateral surface and a second lateral surface opposing the first lateral surface, and the first lateral surface and the second lateral surface are orthogonal to the one of the first direction or the second direction, and wherein the first end of the first conductive line and the third end of the second conductive line pass through the first lateral surface of the insulation film, and the second end of the first conductive line and the fourth end of the second conductive line pass through the second lateral surface of the insulation film.

12. The capacitor device of claim 11, wherein the first conductive line is electrically connected to the first conductive pad, and the second conductive line is electrically connected to the second conductive pad.

* * * * *